United States Patent
Taguchi

(10) Patent No.: US 10,151,944 B2
(45) Date of Patent: Dec. 11, 2018

(54) LAMINATED FILM, ELECTRON ELEMENT, PRINTED CIRCUIT BOARD AND DISPLAY DEVICE

(71) Applicant: Japan Display Inc., Tokyo (JP)

(72) Inventor: Motoyumi Taguchi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/369,185

(22) Filed: Dec. 5, 2016

(65) Prior Publication Data

US 2017/0188469 A1   Jun. 29, 2017

(30) Foreign Application Priority Data

Dec. 25, 2015   (JP) .................. 2015-254441

(51) Int. Cl.
| | |
|---|---|
| G02F 1/1333 | (2006.01) |
| B32B 7/12 | (2006.01) |
| B32B 15/20 | (2006.01) |
| H05K 3/28 | (2006.01) |
| G09G 3/36 | (2006.01) |
| H05K 1/14 | (2006.01) |

(52) U.S. Cl.
CPC .......... *G02F 1/133345* (2013.01); *B32B 7/12* (2013.01); *B32B 15/20* (2013.01); *H05K 3/284* (2013.01); *B32B 2305/02* (2013.01); *B32B 2307/206* (2013.01); *B32B 2457/08* (2013.01); *B32B 2457/202* (2013.01); *G09G 3/3677* (2013.01); *G09G 2300/0426* (2013.01); *G09G 2310/08* (2013.01); *H05K 1/147* (2013.01); *H05K 2201/0116* (2013.01); *H05K 2201/10015* (2013.01); *H05K 2201/10128* (2013.01); *H05K 2203/1311* (2013.01)

(58) Field of Classification Search
CPC ....................................................... H05K 3/4611
USPC ........................................................... 174/260
See application file for complete search history.

(56) References Cited

U.S. PATENT DOCUMENTS

| | | | | |
|---|---|---|---|---|
| 6,870,937 B1 * | 3/2005 | Hirosaki | .............. | H04R 19/005 381/174 |
| 6,985,275 B2 * | 1/2006 | Miyazawa | .......... | H01L 51/5262 313/503 |
| 9,813,823 B2 * | 11/2017 | Suenaga | .............. | H04R 17/005 |

(Continued)

FOREIGN PATENT DOCUMENTS

| | | |
|---|---|---|
| CN | 1423510 A | 6/2003 |
| CN | 206605877 U | 11/2017 |
| JP | 2013-101427 A | 5/2013 |

OTHER PUBLICATIONS

Wang Liqiang et al., "Circuit CAD—Circuit Design and Practice by Protel DXP 2004", Aug. 31, 2008, pp. 5-6.

(Continued)

*Primary Examiner* — Hoa C Nguyen
*Assistant Examiner* — Stanley Tso
(74) *Attorney, Agent, or Firm* — Michael Best & Friedrich LLP

(57) ABSTRACT

According to one embodiment, a laminated film includes a first adhesive layer, a first insulating layer which faces the first adhesive layer, a first metal layer which is located between the first adhesive layer and the first insulating layer, and a first porous layer which is located between the first adhesive layer and the first insulating layer and faces the first metal layer.

13 Claims, 16 Drawing Sheets

(56) References Cited

U.S. PATENT DOCUMENTS

| | | | |
|---|---|---|---|
| 2002/0036345 A1* | 3/2002 | Iseki | H01L 21/563 257/734 |
| 2003/0222334 A1* | 12/2003 | Ikeda | G02F 1/13454 257/678 |
| 2005/0012159 A1* | 1/2005 | Sekimoto | H01L 27/0629 257/379 |
| 2005/0179381 A1* | 8/2005 | Kim | H01J 11/12 313/582 |
| 2006/0097906 A1* | 5/2006 | Heide | G01S 7/032 342/22 |
| 2011/0273906 A1* | 11/2011 | Nichol | G02B 6/0076 362/607 |
| 2013/0113735 A1 | 5/2013 | Takeuchi et al. | |
| 2015/0132623 A1* | 5/2015 | Inagaki | C01G 23/001 429/90 |
| 2016/0233474 A1* | 8/2016 | Kagami | B60L 3/0046 |
| 2016/0343635 A1* | 11/2016 | Rae | H01L 21/31116 |
| 2017/0184930 A1* | 6/2017 | Liu | G02F 1/136209 |
| 2017/0280531 A1* | 9/2017 | Tada | H05B 33/22 |

OTHER PUBLICATIONS

Office Action from China Patent Office for application No. 2016-11201241.8 dated Jul. 2, 2018.

* cited by examiner

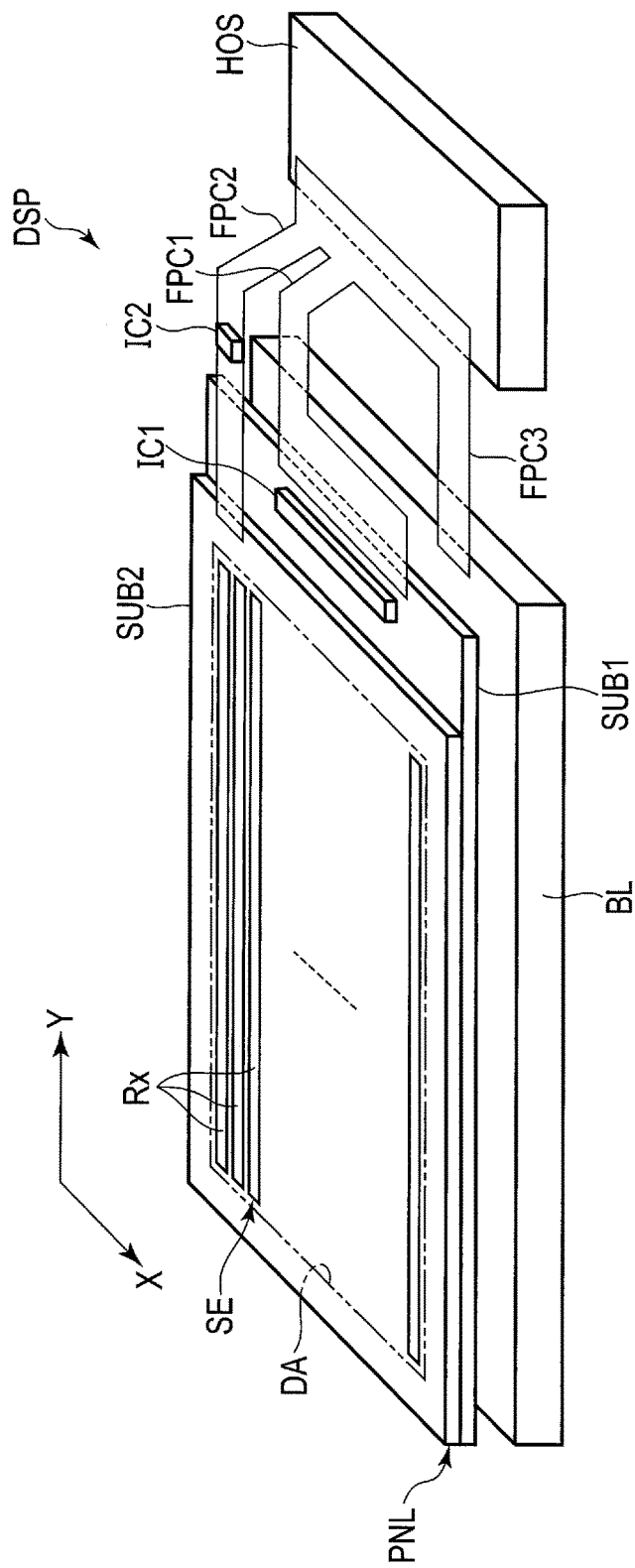
F I G. 1

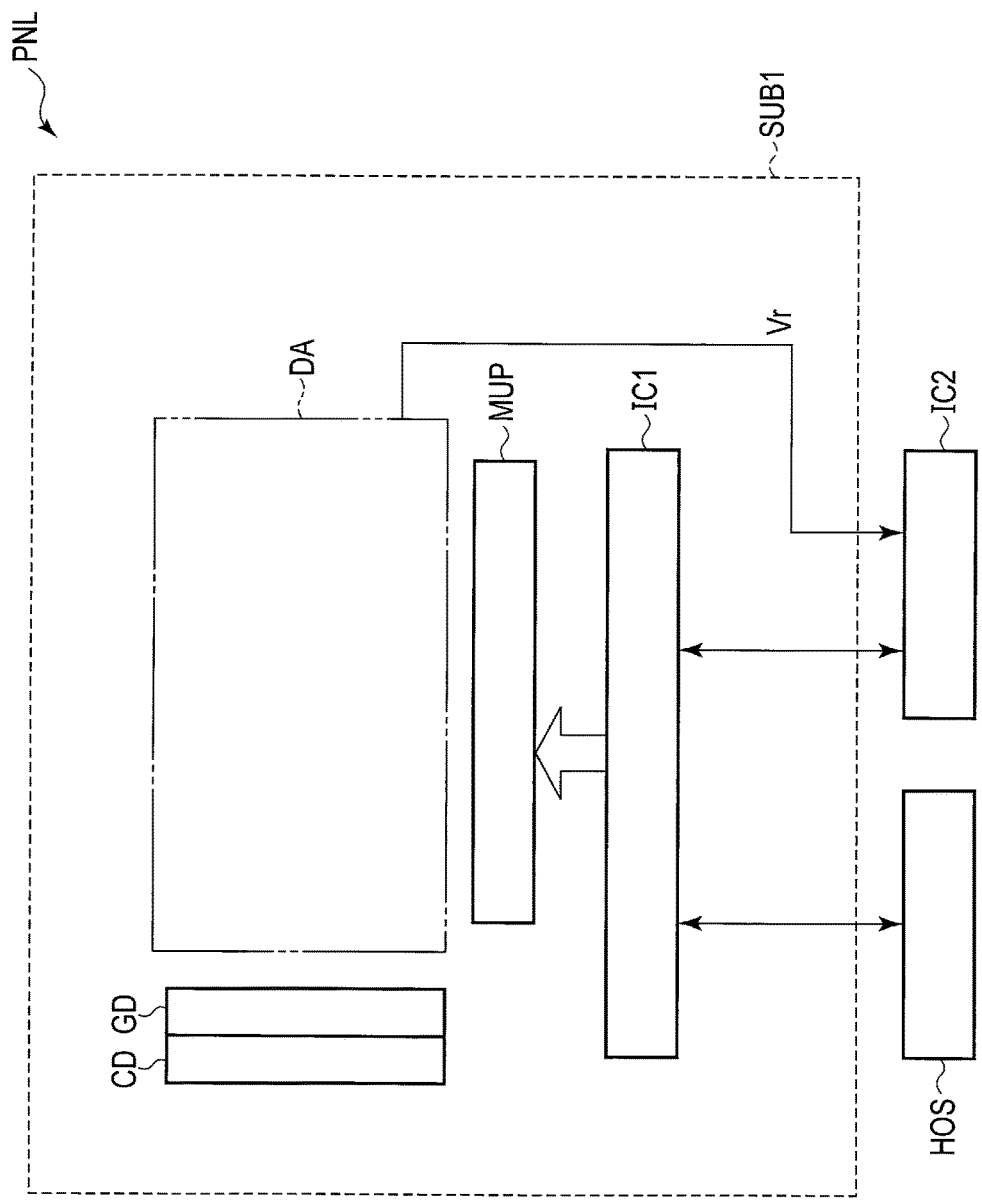
F I G. 2

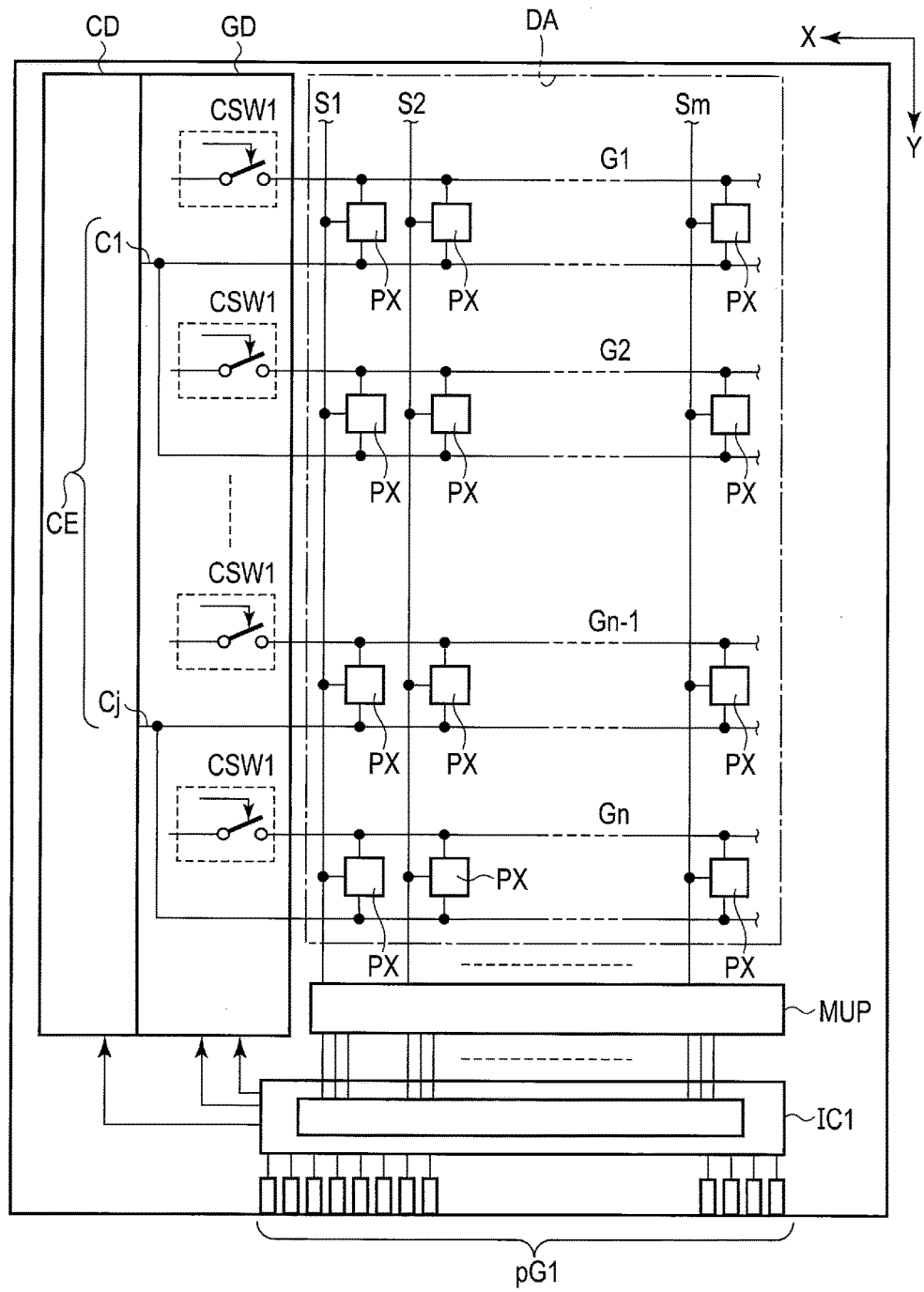
F I G. 3

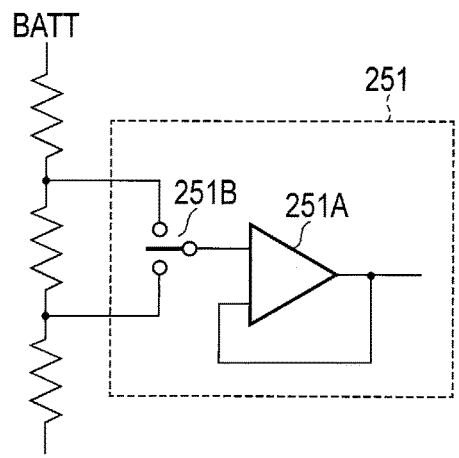
F I G. 8
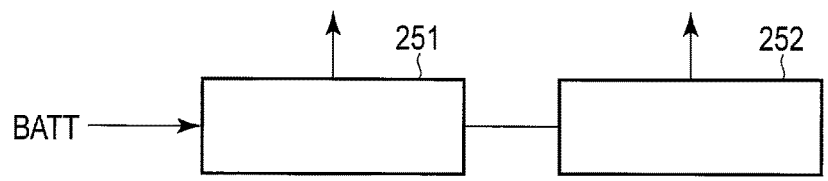
F I G. 9
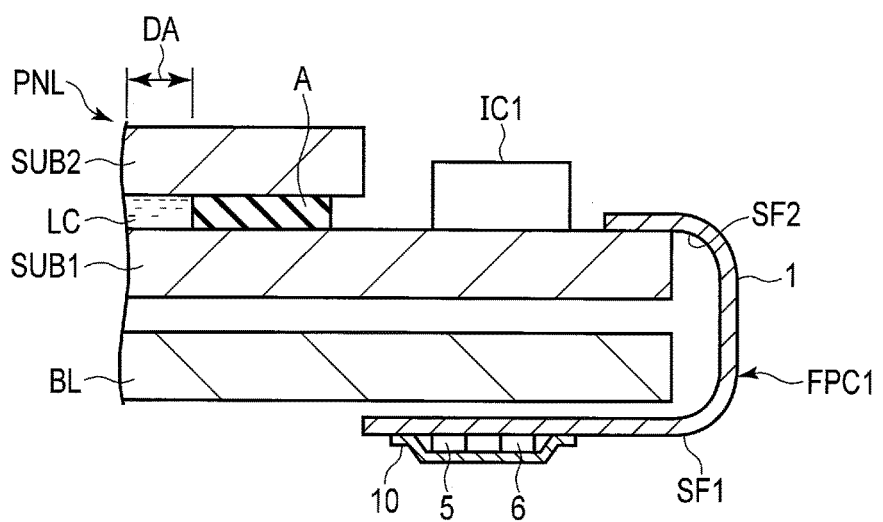
F I G. 10

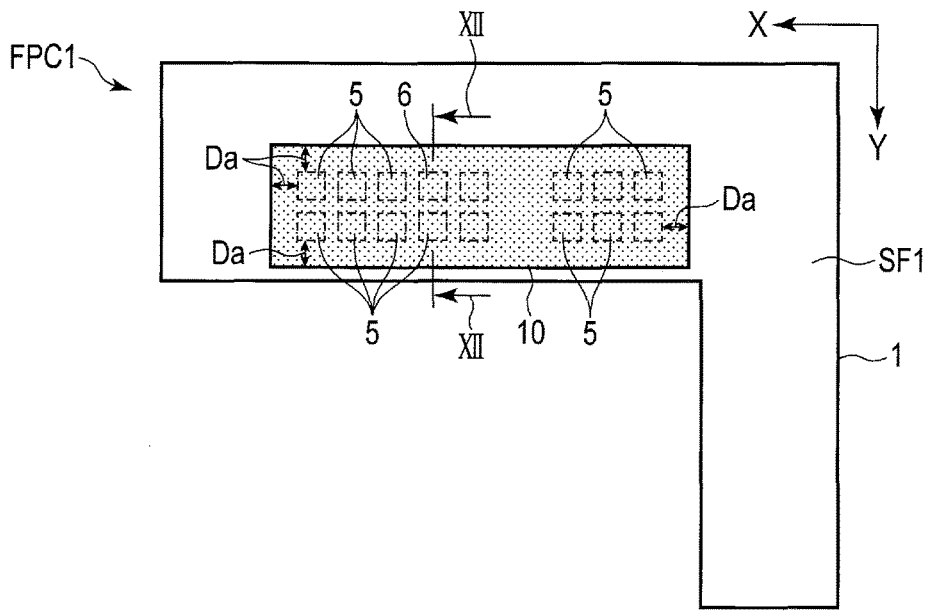
F I G. 11
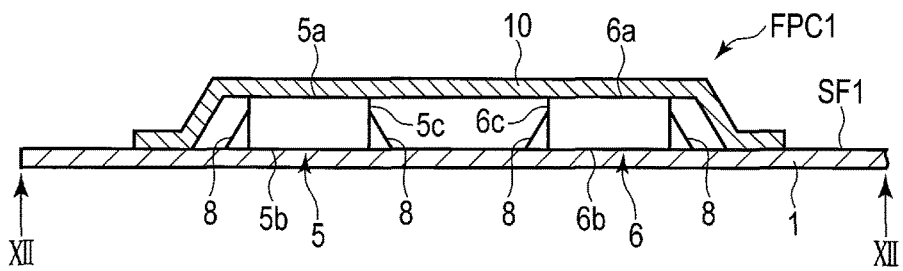
F I G. 12
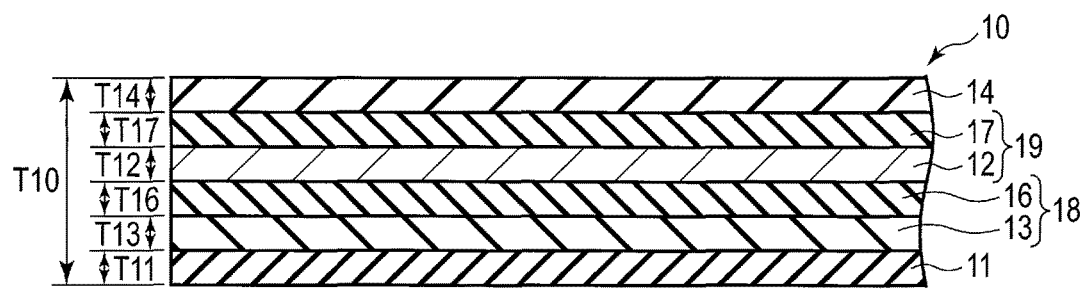
F I G. 13

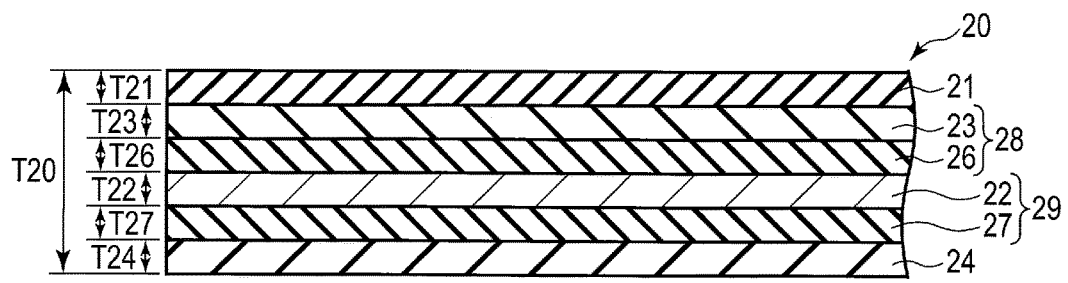
F I G. 17
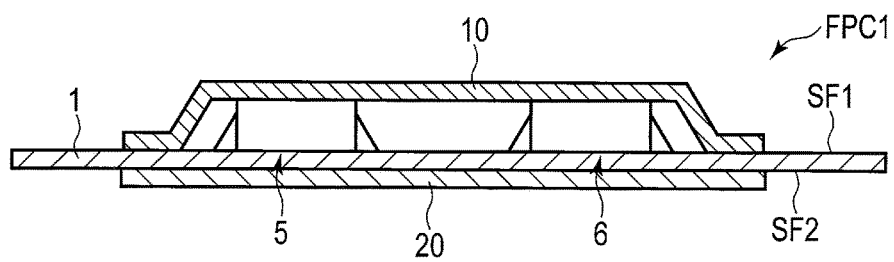
F I G. 18
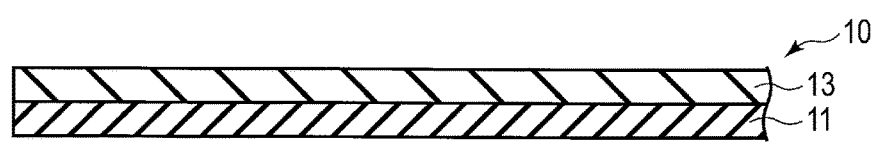
F I G. 19
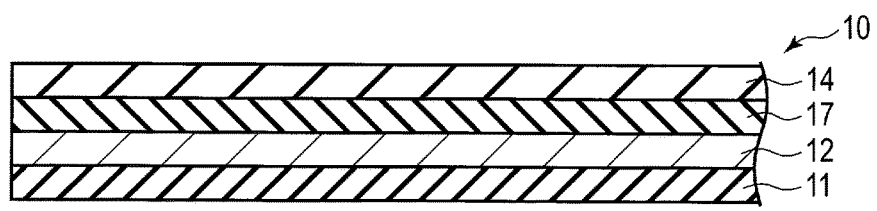
F I G. 20

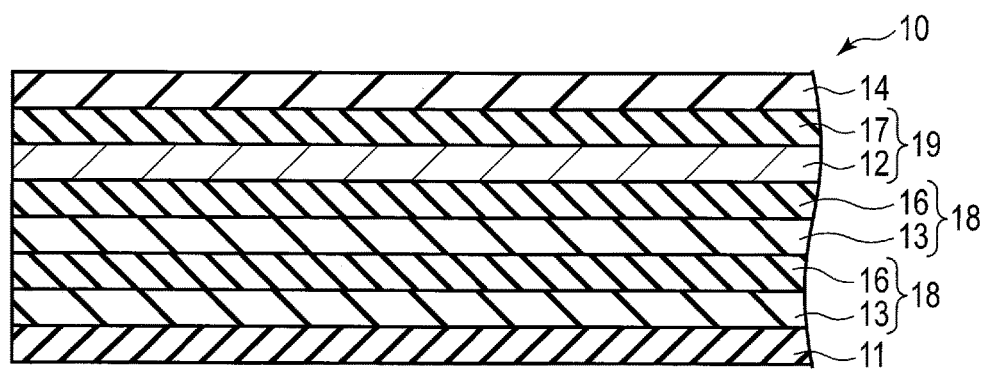
F I G. 21
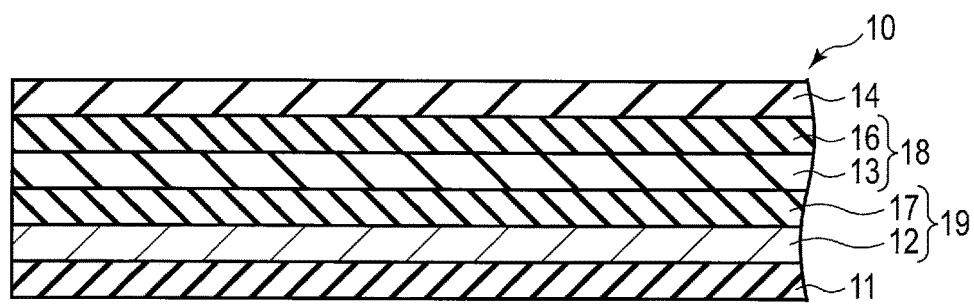
F I G. 22

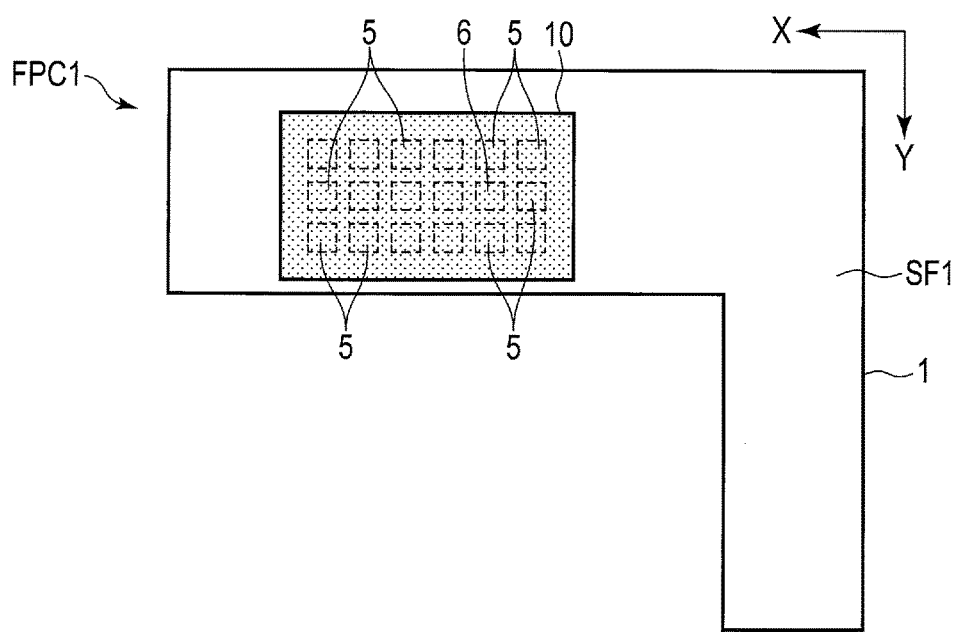
F I G. 23
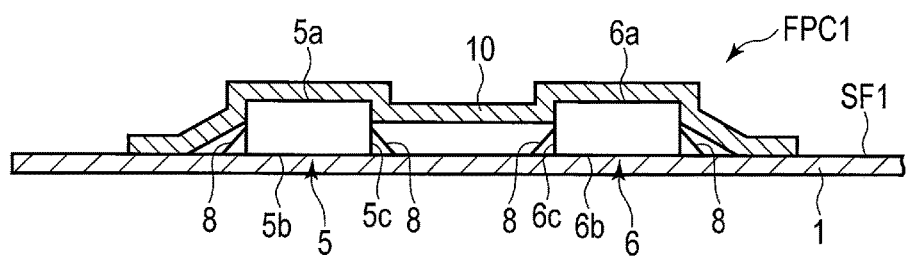
F I G. 24

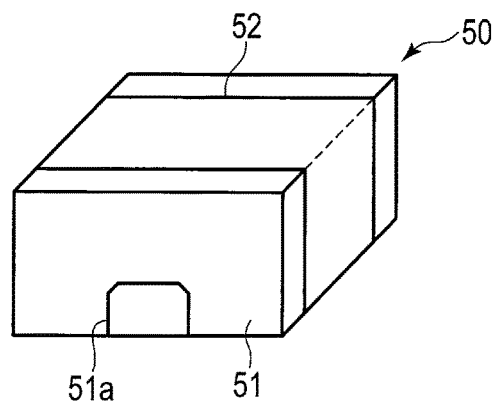
F I G. 25
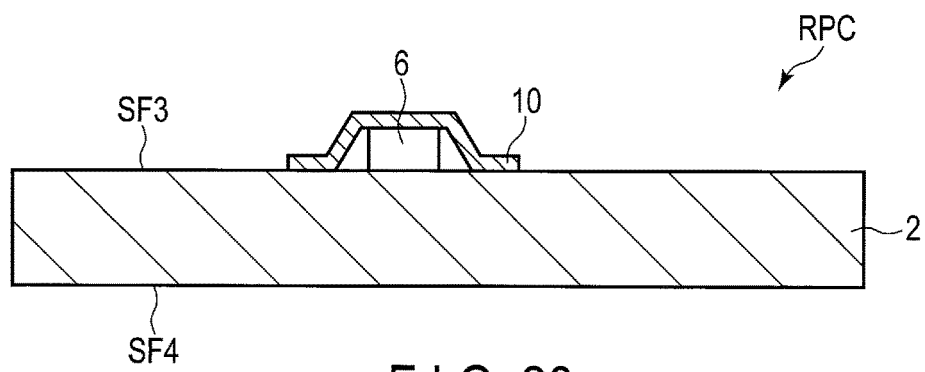
F I G. 26
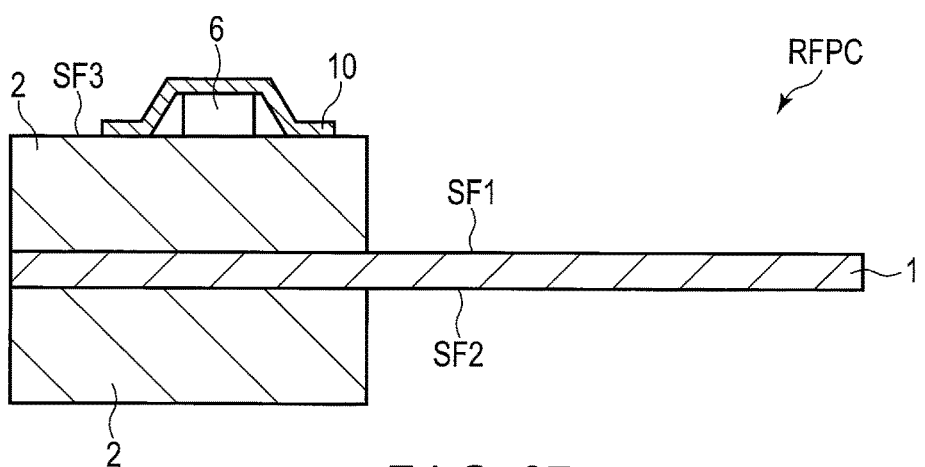
F I G. 27

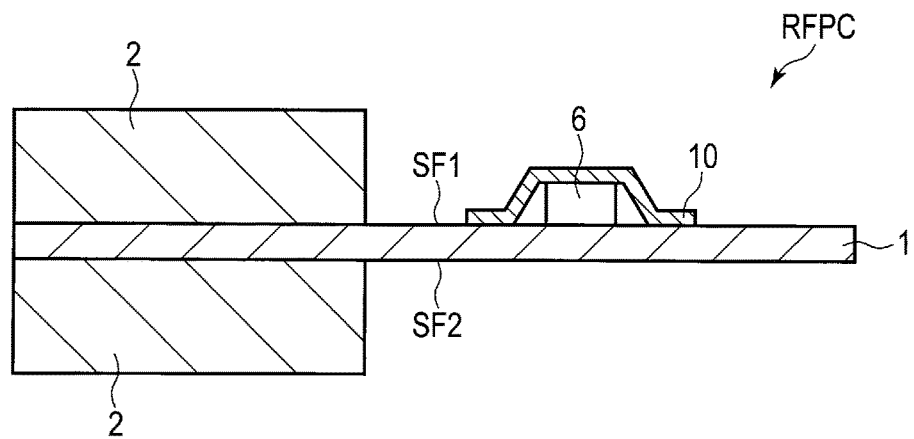
F I G. 28
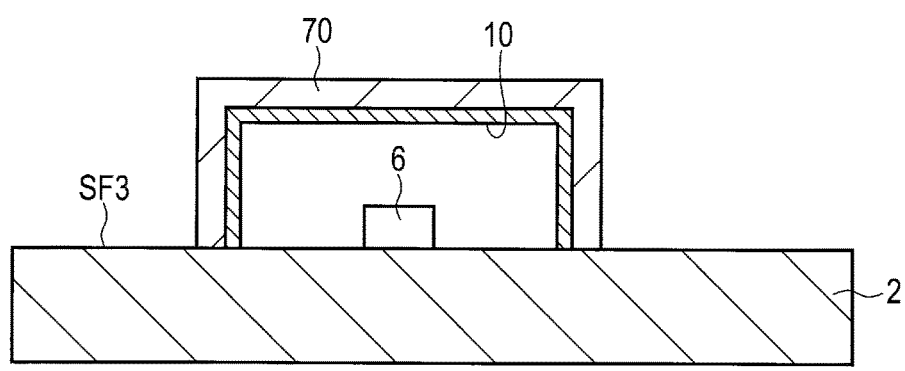
F I G. 29
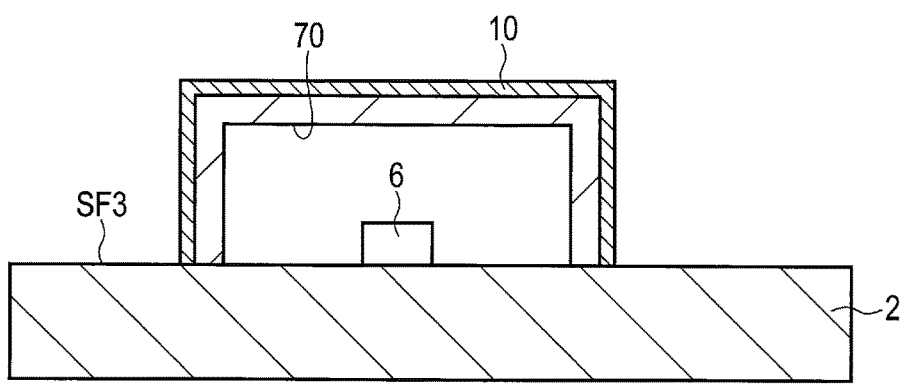
F I G. 30

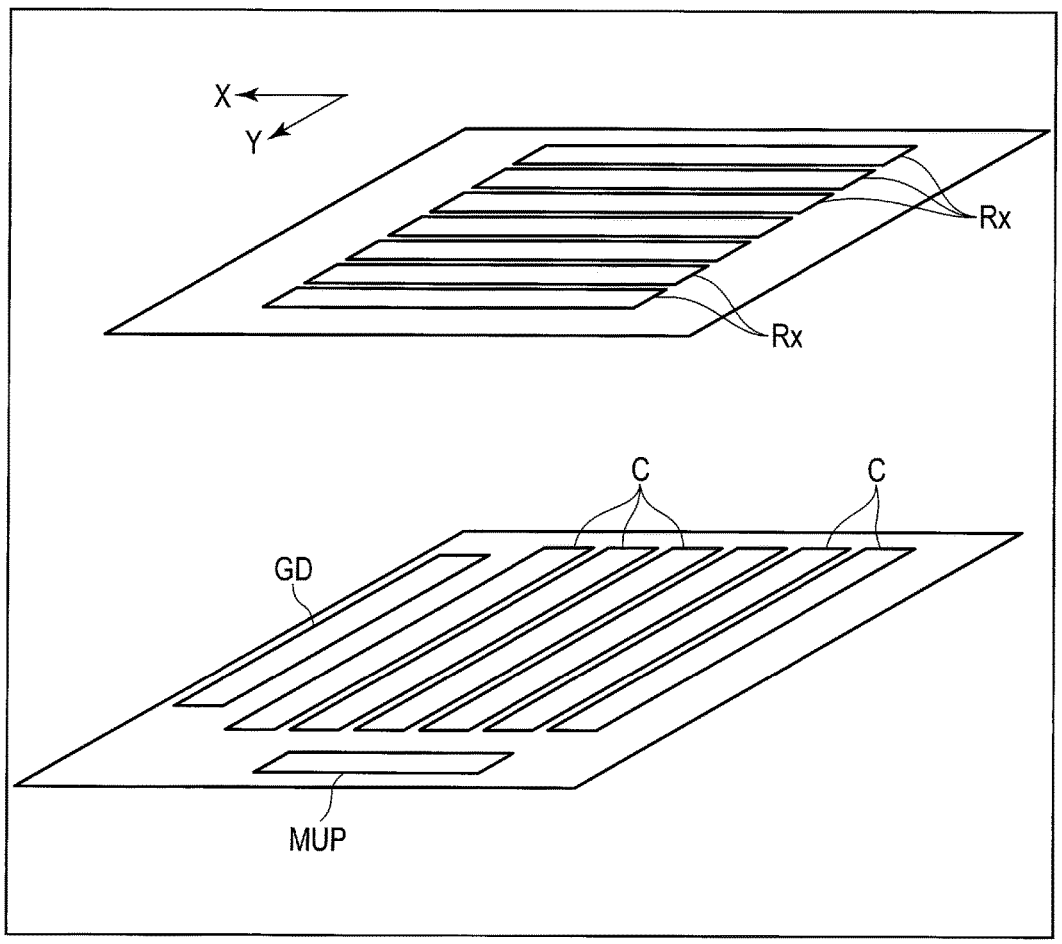
F I G. 31

LAMINATED FILM, ELECTRON ELEMENT, PRINTED CIRCUIT BOARD AND DISPLAY DEVICE

CROSS-REFERENCE TO RELATED APPLICATIONS

This application is based upon and claims the benefit of priority from Japanese Patent Application No. 2015-254441, filed Dec. 25, 2015, the entire contents of which are incorporated herein by reference.

FIELD

Embodiments described herein relate generally to a laminated film, an electron element, a printed circuit board and a display device.

BACKGROUND

In general, as display devices, for example, liquid crystal display devices and organic electroluminescent display devices are known. These display devices are provided in portable devices such as smartphones, PDAs or tablet computers.

When the load on the display panel is changed, a booster circuit or a regulator for driving the liquid crystal cannot follow the change. In this manner, ripples (noise) are produced in the source voltage. The ripples may have various detrimental effects on the liquid crystal display device.

BRIEF DESCRIPTION OF THE DRAWINGS

FIG. 1 is a perspective illustration showing a display device according to a first embodiment.

FIG. 2 shows a part of the liquid crystal display device shown in FIG. 1. FIG. 2 is a block diagram showing the main circuits of the liquid crystal display device.

FIG. 3 shows an equivalent circuit of a part of a first substrate of a liquid crystal display panel shown in FIG. 1 and FIG. 2.

FIG. 6 shows an image signal for driving a plurality of signal lines in an arbitrary frame period, and a drive signal for driving a plurality of split electrodes in the frame period.

FIG. 8 is a circuit diagram showing an example of the structure of a power supply portion inside the driver of FIG. 7.

FIG. 9 is a block diagram showing an example of the structure of the power supply portion inside the driver of FIG. 7.

FIG. 10 is a cross-sectional view showing an end portion of the liquid crystal display device according to the first embodiment. FIG. 10 shows a flexible printed circuit, etc.

FIG. 11 is a plan view showing the flexible printed circuit according to the first embodiment.

FIG. 12 is a cross-sectional view showing the flexible printed circuit along line XII-XII of FIG. 11.

FIG. 13 is a cross-sectional view showing a laminated film shown in FIG. 10 to FIG. 12.

FIG. 17 is a cross-sectional view showing a laminated film shown in FIG. 15 and FIG. 16.

FIG. 18 is a cross-sectional view showing a part of a flexible printed circuit provided in a liquid crystal display device according to a third embodiment.

FIG. 19 is a cross-sectional view showing modification example 1 of the laminated film of the first embodiment.

FIG. 20 is a cross-sectional view showing modification example 2 of the laminated film of the first embodiment.

FIG. 21 is a cross-sectional view showing modification example 3 of the laminated film of the first embodiment.

FIG. 22 is a cross-sectional view showing modification example 4 of the laminated film of the first embodiment.

FIG. 23 is a plan view showing modification example 1 of the flexible printed circuit of the first embodiment.

FIG. 24 is a cross-sectional view showing modification example 2 of the flexible printed circuit of the first embodiment.

FIG. 25 is a perspective illustration showing a capacitor and the laminated film according to a modification example of the first to third embodiments.

FIG. 26 is a cross-sectional view showing modification example 1 of a printed circuit board according to the first to third embodiments.

FIG. 27 is a cross-sectional view showing modification example 2 of the printed circuit board according to the first to third embodiments.

FIG. 28 is a cross-sectional view showing modification example 3 of the printed circuit board according to the first to third embodiments.

FIG. 29 is a cross-sectional view showing modification example 4 of the printed circuit board according to the first to third embodiments.

FIG. 30 is a cross-sectional view showing modification example 5 of the printed circuit board according to the first to third embodiments.

FIG. 31 shows a modification example of the structure of the sensor.

DETAILED DESCRIPTION

Figure 4:
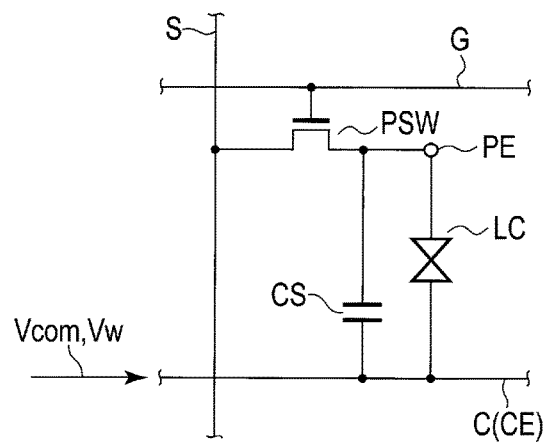
FIG. 4 shows an equivalent circuit of each pixel shown in FIG. 3.

In general, according to one embodiment, there is provided a laminated film comprising: a first adhesive layer; a first insulating layer which faces the first adhesive layer; a first metal layer which is located between the first adhesive layer and the first insulating layer; and a first porous layer which is located between the first adhesive layer and the first insulating layer and faces the first metal layer.

According to another embodiment, there is provided an electron element comprising a capacitor, and a laminated film stuck to a surface of the capacitor. The laminated film comprises a first adhesive layer, and at least one of a first metal layer and a first porous layer located beyond the first adhesive layer from the capacitor.

According to another embodiment, there is provided a printed circuit board comprising: a core substrate which comprises a first surface, and a second surface opposite to the first surface; an oscillatory source provided on the first surface of the core substrate; and a laminated film which is provided beyond the oscillatory source from the first surface and is stuck to the oscillatory source, or faces the oscillatory source through the core substrate and is stuck to the second surface. The laminated film comprises a first adhesive layer, and at least one of a first metal layer and a first porous layer located beyond the first adhesive layer from the core substrate.

According to another embodiment, there is provided a display device comprising a display panel, and a printed circuit board coupled to the display panel. The printed circuit board comprises: a core substrate which comprises a first surface, and a second surface opposite to the first surface; an oscillatory source provided on the first surface of the core substrate; and a laminated film which is provided beyond the oscillatory source from the first surface and is stuck to the oscillatory source, or faces the oscillatory source through the core substrate and is stuck to the second surface. The laminated film comprises a first adhesive layer, and at least one of a first metal layer and a first porous layer located beyond the first adhesive layer from the core substrate.

To begin with, the basic concept of embodiments of the invention is described.

Recently, for example, a touch sensor function has been added to the display devices. In liquid crystal display devices in which a touch sensor function is incorporated into a display panel, the following structure is known. The touch sensor is operated in a blanking period (hereinafter, referred to as a non-display period), which is off a display driving period (hereinafter, referred to as a display period).

The load to drive the panel differs between a display period and a sensing operation period (hereinafter, referred to as a sensing period) for the touch sensor. Thus, when a display period and a sensing period are set periodically, the load on the display panel may be changed periodically. When the load is changed, a booster circuit or a regulator for driving the liquid crystal cannot follow the change. In this manner, ripples (noise) are produced in the source voltage. The ripples may have various detrimental effects on the liquid crystal display device.

Thus, in the embodiments of the invention, by clarifying the causes of the above problems and solving the problems, a laminated film, an electron element, a printed circuit board and a display device, preventing the problems caused by oscillation can be obtained. Next, means for solving the above problems will be described.

Various embodiments will be further described with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

First Embodiment

This specification explains a display device according to a first embodiment.

FIG. 1 is a perspective illustration showing the display device according to the first embodiment. In the present embodiment, the display device DSP is a liquid crystal display device comprising a sensor.

As shown in FIG. 1, the display device DSP comprises a display panel PNL. In the present embodiment, the display panel PNL is a liquid crystal display panel. The display panel PNL comprises a first substrate SUB1, and a second substrate SUB2 facing the first substrate SUB1 with a predetermined gap between the first substrate SUB1 and the second substrate SUB2. The display panel PNL comprises a display functional layer (not shown) held between the first substrate SUB1 and the second substrate SUB2, such as a liquid crystal layer. The first substrate SUB1 may be called an array substrate. The second substrate SUB2 may be called a counter-substrate. A driver IC1 for driving the display panel PNL is provided on the first substrate SUB1. The driver IC1 may be provided on a flexible printed circuit FPC1 in a manner different from that of the first embodiment. The driver IC1 may be called a first IC chip or a drive circuit.

The display panel PNL comprises a display area DA which displays an image. The display area DA may be called an active area. In the display area DA, the display panel PNL comprises, for example, a sensor SE which detects the change in capacitance. The sensor SE may be provided outside the display area DA in a manner different from that of the present embodiment. The sensor SE comprises detection electrodes Rx provided on the second substrate SUB2, and a common electrode provided on the first substrate SUB1. The common electrode is explained later. The type of sensor SE is called an in-cell type. The principle of operation of the in-cell sensor SE is described later. To prevent degradation of display quality, the detection electrodes Rx may be formed using a transparent conductive layer using a transparent conductive material such as indium tin oxide (ITO), indium zinc oxide (IZO) or zinc oxide (ZnO), and a thin metal line having a width of approximately 2 to 5 μm.

The thin metal line is formed of at least one metal material selected from aluminum (Al), copper (Cu), silver (Ag), molybdenum (Mo) and an alloy thereof. The thin metal line may be a laminated body in which a plurality of layers are stacked using at least one of the metal materials. The resistance of at least one metal material selected from aluminum (Al), copper (Cu), silver (Ag) and an alloy thereof is less than that of phototransmissive conductive oxide such as ITO as the material of a transparent electrode.

At least one metal material selected from aluminum (Al), copper (Cu), silver (Ag) and an alloy thereof has a light-shielding property in comparison with phototransmissive conductive oxide such as ITO. Thus, the transmittance may be reduced, or the pattern of the detection electrodes Rx may be visually identified. In the present embodiment, each detection electrode Rx comprises a plurality of thin metal lines. When the thin metal lines are arranged in a mesh form at intervals greater than the line width, it is possible to reduce the resistance and make the pattern of the detection electrodes Rx invisible. As a result, the resistance of the detection electrodes Rx is reduced. Thus, the display device DSP can contribute to realization of at least one of a flat screen, a large screen and high fineness.

The sensor SE is driven by a drive signal from the driver IC1. Its output signal is detected by a controller IC2. The controller IC2 may be called a second IC chip or a sensor circuit.

The display device DSP comprises an application processor HOS, and flexible printed circuits FPC1, FPC2 and FPC3 as printed circuit boards. In the present embodiment, the flexible printed circuits FPC1, FPC2 and FPC3 are coupled to each other, and are integrally formed. The application processor HOS may be called a first controller. The application processor HOS is coupled to the display panel PNL via the flexible printed circuit FPC1 and the driver IC1. The application processor HOS is coupled to the sensor SE via the flexible printed circuit FPC2. The driver IC1 mutually cooperates with the controller IC2 in terms of operation timing. The driver IC1 is electrically connected to the controller IC2 by a timing pulse, etc. The driver IC1 and the controller IC2 may be structured in the same chip.

In the present embodiment, the driver IC1 is synchronized with the controller 102 via the flexible printed circuits FPC1 and FPC2. The flexible printed circuits FPC1, FPC2 and FPC3 may not be integrally formed, and may be independently provided. The flexible printed circuits FPC1, FPC2 and FPC3 may be coupled to each other via a connector, an anisotropic conductive film (ACF) or solder.

The flexible printed circuits FPC1, FPC2 and FPC3 are coupled to each other. However, they may employ a different structure. For example, at least one of the flexible printed circuits FPC2 and FPC3 may be connected to an interconnect on the first substrate SUB1 in place of the flexible printed circuit FPC1, and be connected to the driver IC1 via the interconnect.

Alternatively, each of the flexible printed circuits FPC1 and FPC2 may be coupled to the application processor HOS. The application processor HOS may control synchronism between the driver IC1 and the controller 102.

An illumination unit which illuminates the display panel PNL is provided under the first substrate SUB1. The illumination unit and the second substrate SUB2 are located on opposite sides of the first substrate SUB1, respectively; that is, they are located opposite to each other with respect to the first substrate SUB1. The illumination unit is, for example, a backlight unit BL. The flexible printed circuit FPC3 couples the backlight unit BL and the application processor HOS. Various forms may be applied to the backlight unit BL. As the light source, for example, a light-emitting diode (LED) is used.

The illumination unit is not limited to the backlight unit, and may be a front-light unit provided on the second substrate SUB2. When the display panel PNL is a reflective type liquid crystal display panel, an organic electroluminescent display panel or other self-luminous display devices, the display device DSP may be formed without the illumination unit.

The flexible printed circuit FPC3 may be connected to an interconnect on the first substrate SUB1 in place of the application processor HOS, and be connected to the driver IC1 via the interconnect. In this case, the driver IC1 is capable of controlling the illumination unit.

FIG. 2 shows a part of the display device shown in FIG. 1. FIG. 2 is a block diagram showing the main circuits of the display device. In FIG. 2, the portion surrounded by the dashed line shows the first substrate SUB1.

As shown in FIG. 2, a scanning line drive circuit GD is formed, for example, on the left side of the non-display area of the first substrate SUB1. The scanning line drive circuit GD drives the scanning lines described later. A common electrode drive circuit CD is provided in parallel with the scanning line drive circuit GD. The common electrode drive circuit CD drives the common electrode described later. A signal line selection circuit MUP, which may be called a multiplexer, is located on the lower side of the non-display area. The signal line selection circuit MUP is formed by, for example, a demultiplexer. The signal line selection circuit MUP is supplied with signals corresponding to a plurality of signal lines, and selectively outputs the signals to the respective signal lines by switching switches.

The driver IC1 controls the scanning line drive circuit GD, the common electrode drive circuit CD, etc. The driver IC1 is capable of writing a pixel signal to each pixel of the display area DA via the signal line selection circuit MUP.

The controller 102 is capable of processing a detection signal Vr obtained from each detection electrode Rx, and obtaining data such as the coordinates of the position of the detected object, for example, a user's finger which is in contact with or adjacent to the display surface of the display device DSP. At least one of the driver IC1 and the controller 102 mutually communicates with the application processor HOS in order to request or receive data.

The application processor HOS supplies video data, a command, a synchronous signal, etc., to at least one of the driver IC1 and the controller IC2.

FIG. 3 shows an equivalent circuit of a part of the first substrate SUB1 of the display panel PNL shown in FIG. 1 and FIG. 2.

As shown in FIG. 3, the signal line selection circuit MUP, the scanning line drive circuit GD, the common electrode drive circuit CD and an outer lead bonding pad group pG1 (hereinafter, referred to as an OLB-pad group) are formed in the non-display area of the first substrate SUB1.

The driver IC1 is connected to the signal line selection circuit MUP, the scanning line drive circuit GD, the common electrode drive circuit CD and the OLB-pad group pG1. Although every structure is not shown, the driver IC1 is connected to the scanning line drive circuit GD by a control line. The driver IC1 is capable of supplying a control signal to each control switching element CSW1 via the control line.

The first substrate SUB1 comprises a plurality of scanning lines G (G1 to Gn) extending in a first direction X in the display area DA, and a plurality of signal lines S (S1 to Sm) extending in a second direction Y intersecting with the first direction X in the display area DA. The scanning lines G (G1 to Gn) are arranged at predetermined intervals in the second direction Y. The signal lines S (S1 to Sm) are arranged at predetermined intervals in the first direction X.

A plurality of pixels PX are arranged in matrix in the display area DA. The pixels PX are located near the respective intersections of the scanning lines G and the signal lines S between the first substrate SUB1 and the second substrate (not shown). Thus, m×n pixels PX are arranged in matrix in the first and second directions X and Y, where m and n are positive integers. Further, on the first substrate SUB1, the common electrode CE is formed. The common electrode CE is used as an electrode to drive the pixels PX, and is used as an electrode to drive the sensor SE as explained later. In a manner different from that of the present embodiment, the common electrode CE may be provided on the second substrate SUB2 side instead of the first substrate SUB1 side depending on the display mode of the display panel PNL.

The scanning lines G extend in the first direction X to the outside of the display area DA, and are connected to the scanning line drive circuit GD. The scanning line drive circuit GD comprises the control switching elements CSW1. The scanning lines G (G1, G2, . . . , Gn) are connected to their respective control switching elements CSW1.

The signal lines S (S1 to Sm) extend in the second direction Y, and intersect with the scanning lines G (G1, G2, . . . , Gn) in a plan view. The signal lines S are arranged at predetermined intervals in the first direction X. The signal lines S (S1 to Sm) extend to the outside of the display area DA, and are connected to the signal line selection circuit MUP.

The common electrode CE comprises a plurality of split electrodes C (C1, C2, . . . , Cj). The split electrodes C extend in the first direction X, and are arranged at intervals in the second direction Y. Thus, the split electrodes C extend along the scanning lines G (G1, G2, . . . , Gn), and intersect with the signal lines S (S1 to Sm) in a plan view. The split electrodes C extend to the outside of the display area DA, and are connected to the common electrode drive circuit CD. The scanning lines G, the signal lines S and the split electrodes C may not extend linearly, and may be partially curved unlike the figure. The number or shape of split electrodes C is not particularly limited, and may be modified in various ways.

In the present embodiment, each split electrode C is formed like a belt, and is shared by the pixels PX in three rows. In this case, the number of split electrodes C is a third of the number of scanning lines G (j=n/3).

The scanning line drive circuit GD comprises n control switching elements CSW1. Each of the n control switching elements CSW1 is selectively set to an on-state and an off-state. In this manner, it is possible to give permission to write an image signal to a corresponding pixel PX or prohibit writing an image signal to a corresponding pixel PX.

Pixel signals are written to the pixels PX connected to a selected scanning line via the signal line selection circuit MUP.

FIG. 4 is an equivalent circuit diagram of each pixel PX shown in FIG. 3.

As shown in FIG. 4, the pixel PX comprises a pixel switching element PSW, a pixel electrode PE, the common electrode CE, etc. The pixel switching element PSW is formed by, for example, a thin-film transistor (TFT). The pixel switching element PSW is electrically connected to the scanning line G and the signal line S. The pixel switching element PSW may be either a top-gate TFT or a bottom-gate TFT. The semiconductor layer of the pixel switching element PSW is formed of, for example, polycrystalline silicon. However, the semiconductor layer may be formed of amorphous silicon or an oxide semiconductor. The common electrode CE and the pixel electrode PE are formed of a transparent conductive material such as ITO, IZO or ZnO. Common voltage Vcom is applied to the common electrode CE in a display driving period. A drive signal Vw is supplied to the common electrode CE in a sensing period.

The pixel electrode PE is electrically connected to the pixel switching element PSW. The pixel electrode PE faces the split electrode C (common electrode CE) via an insulating film. The split electrode C, the insulating film and the pixel electrode PE form storage capacitance CS. When the pixel switching element PSW is set to an on-state by a control signal supplied from the scanning line G, the pixel signal output from the signal line selection circuit MUP to the signal line S is written to and held by the storage capacitance CS. The alignment state of liquid crystal molecules of a liquid crystal layer LC is changed based on the voltage generated in the storage capacitance CS. Thus, the polarized light which passes through the liquid crystal is modulated. In FIG. 4, one pixel PX is shown as a representative pixel. However, when one of the control switching elements CSW1 shown in FIG. 3 is set to an on-state, the pixel switching elements PSW of the pixels PX connected to a corresponding scanning line G are set to an on-state. Thus, the pixel signal from each signal line S connected to the pixel switching elements PSW is written to the storage capacitance CS of corresponding pixels PX.

Now, this specification explains the basic operation of the above in-cell sensor SE. Here, this specification explains the basic operation of the sensor in a mutual-capacitive detection system.

Figure 5:
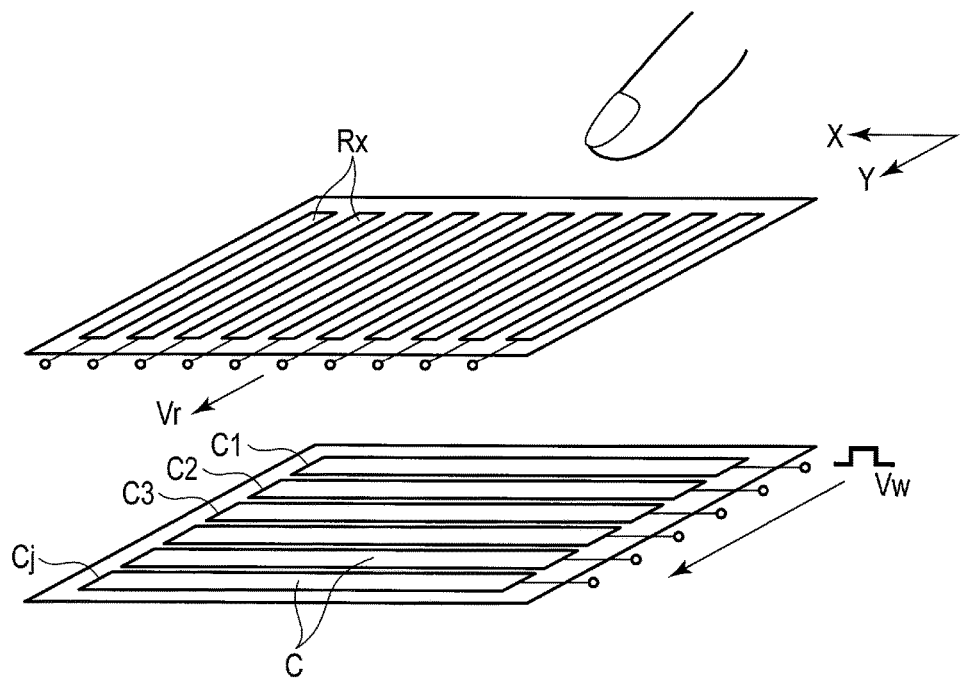
FIG. 5 shows an example of the basic structure of a sensor.

FIG. 5 shows an example of the basic structure of the sensor SE.

As shown in FIG. 5, the detection electrodes Rx are formed in stripes in the second direction Y on the second substrate SUB2. The split electrodes C are formed on the first substrate SUB1. The detection electrodes Rx intersect with the split electrodes C.

The split electrodes C are driven in series in a plurality of sensing periods TDT as described later. For example, a split electrode C1 is driven by a drive signal Vw in a first sensing period TDT. A split electrode C2 is driven by a drive signal Vw in a second sensing period TDT. A split electrode C3 is driven by a drive signal Vw in a third sensing period TDT. A drive signal may be called a drive signal in a sequential high frequency pulse form, or a scanning signal. In a scanning period, a low detection signal Vr is detected from each detection electrode Rx adjacent to the detected object such as a finger in comparison with the output from the other detection electrodes Rx for the following reason. In addition to first capacitance generated between the split electrodes C and the detection electrodes Rx adjacent to the finger, second capacitance is generated between these detection electrodes Rx and the finger. Between the other detection electrodes Rx and the split electrodes C, the second capacitance by the finger is not generated, and only the first capacitance is generated.

The coordinates of the position of the finger can be determined based on the timing of driving the split electrodes C, and the positions of the detection electrodes Rx which output low detection signals Vr.

Figure 6:
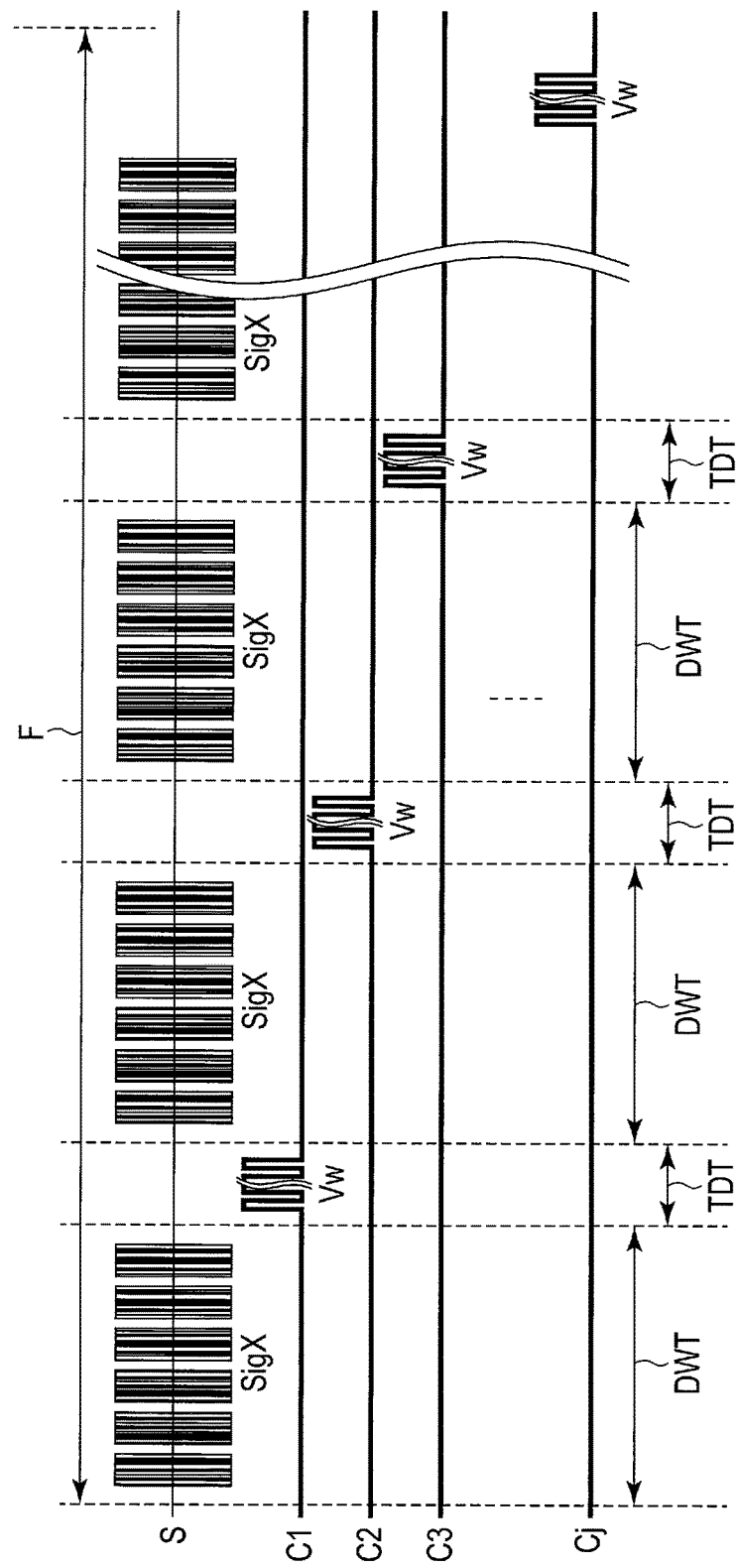
FIG. 6 is a timing chart shown for explaining a method of driving the liquid crystal display device.

FIG. 6 is a timing chart shown for explaining a method of driving the display device DSP. FIG. 6 shows an image signal SigX for driving the signal lines S (S1, S2, . . . , Sm) in an arbitrary frame period F, and a drive signal Vw for driving the split electrodes C (C1, C2, C3, . . . , Cj) in the frame period F.

As shown in FIG. 6, each frame period F has a plurality of split display driving periods DWT. In the display driving periods DWT, pixel signals SigX are written to the signal lines S. Each sensing period TDT is a non-display driving period, and is set between the display driving periods DWT. In the sensing periods TDT, the split electrodes C (C1, C2, C3, . . . ) are driven by drive signals Vw.

In the present embodiment, a sensing period is disclosed as a non-display driving period. However, a non-display driving period also includes periods other than a sensing period. For example, a non-display driving period includes a period for resetting the input state of a signal to each pixel between display driving periods. When the split electrodes C are driven by a drive signal Vw, and further when a user's finger is in contact with or adjacent to the display surface, a low detection signal Vr is output from each detection electrode Rx corresponding to the position of the finger. The basic structure and operation of the sensor SE are described above.

In the above explanation, one split electrode C is driven by a drive signal Vw in each sensing period TDT. However, the driving method is not limited to this example. A plurality of split electrodes C may be concurrently driven by a drive signal Vw in each sensing period TDT. Alternatively, all of the split electrodes C may be concurrently driven by a drive signal Vw in each sensing period TDT.

In the present embodiment shown in FIG. 6, one frame period is divided into a plurality of periods. Display driving and sensing driving are repeated a plurality of times. However, other systems may be employed. For example, display driving for one frame may alternate with sensing driving for one screen.

Figure 7:
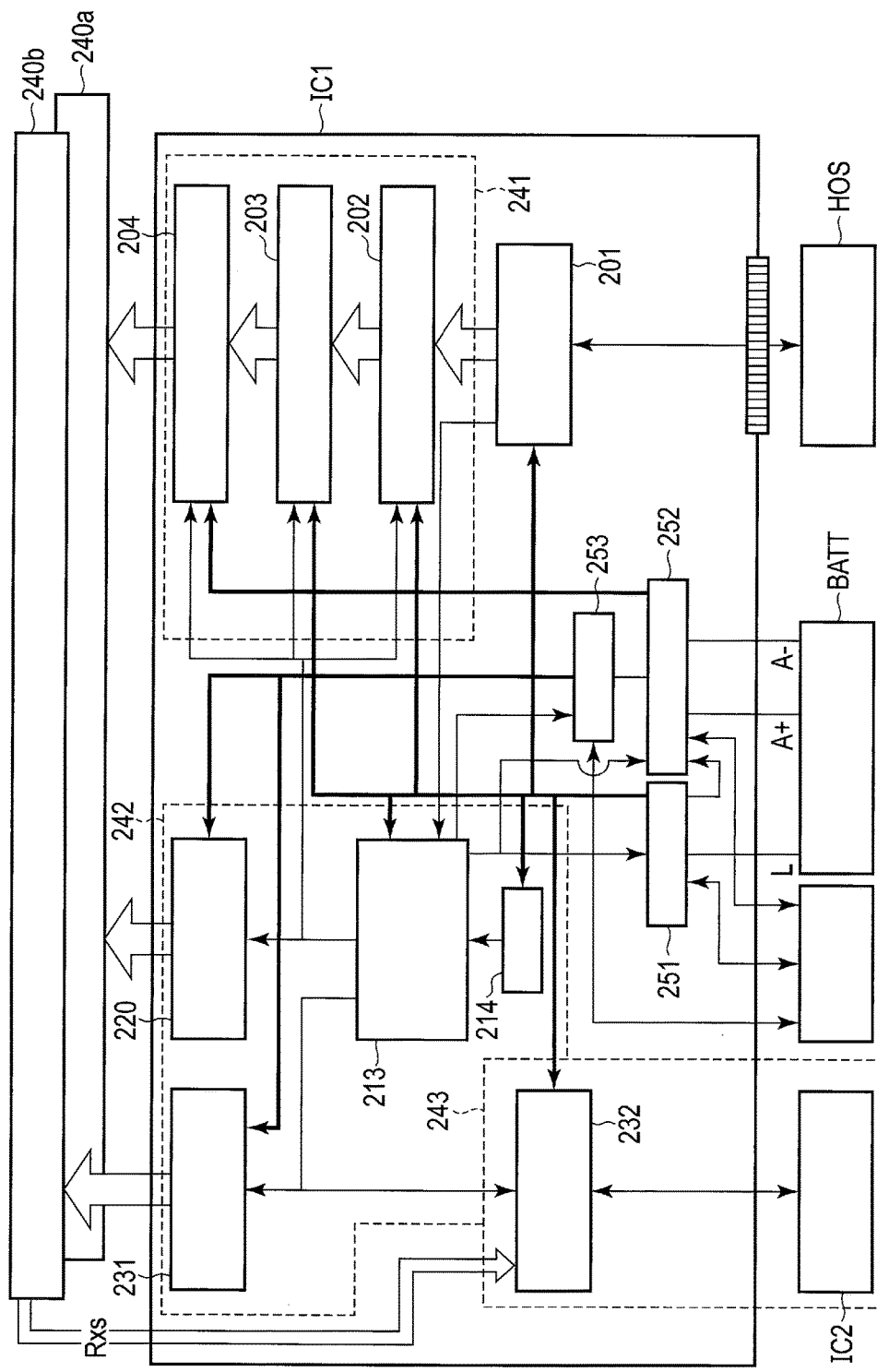
FIG. 7 shows an example of the block diagram inside a driver according to the first embodiment.

Now, this specification specifically explains an example of the block diagram inside the driver IC1 as an IC chip with reference to FIG. 7.

As shown in FIG. 7, the image data from the application processor HOS is input to an image memory 202 via an interface receiver 201. The image data read from the image memory 202 is latched by a line latch circuit 203. The line latch circuit 203 is capable of latching the image data for one line or a plurality of lines of the display panel PNL.

The image data is Digital-to-analog converted in an amplifier 204. The image data is subjected to gamma correction by the amplifier. In this way, a pixel signal is generated. The pixel signal is written to each pixel PX arrayed in a pixel array portion 240a provided on the display panel PNL. Specifically, the pixel signal is input to each pixel PX arrayed in a two-dimensional manner in the display area DA via the signal line selection circuit MUP shown in FIG. 2. The pixel signal is written to the storage capacitance CS explained in FIG. 4.

The block including the image memory 202, the line latch circuit 203, the amplifier 204, etc., may be collectively called an image data processor 241.

For example, a synchronous signal and a command from the application processor HOS are loaded by the interface receiver 201. The synchronous signal loaded by the interface receiver 201 is input to a timing controller 213. The command loaded by the interface receiver 201 is input to and interpreted by a register (not shown). The result of interpretation is reflected on the timing pulse generation of the timing controller 213, etc. The interface receiver 201 converts the external clock rate of digital data transmitted from the application processor HOS into an internal clock rate for internal digital data. For example, the write operation of the interface receiver 201 is synchronized with an external clock. The read operation is synchronized with an internal clock.

The timing controller 213 may comprise a plurality of logic circuits, and an application which controls the logic circuits. Alternatively, the timing controller 213 may be structured by hardware comprising a logic circuit, a counter, etc. The timing controller 213 is capable of setting the operation mode and the operation sequence of the driver IC1, and switching the operation mode. The operation mode includes a display driving period DWT including a write period in which a pixel signal is written to the pixels of each horizontal line, and a sensing period TDT (non-display driving period). Thus, the timing controller 213 can be synchronized with an external horizontal synchronous signal from the interface receiver 201 with reference to it. The timing controller 213 generates various timing pulses for realizing various operations based on the internal clock from an oscillator 214.

Various timing pulses output from the timing controller 213 for display control are input to the image memory 202, the line latch circuit 203, the amplifier 204 and a panel control signal generation module 220. Various timing pulses output from the timing controller 213 for the sensor are further input to a detection electrode control signal generation module 231 and a sensor interface 232.

The panel control signal generation module 220 generates a drive signal for the scanning line drive circuit GD and the common electrode drive circuit CD, and realizes image display by the display panel PNL.

The detection electrode control signal generation module 231 is capable of supplying a drive signal Vw to the common electrode CE. When a drive signal Vw is supplied to the common electrode CE, it is possible to obtain the detection signal Vr of the contacted object from each detection electrode Rx. The detection signal Vr is input to the controller IC2. The controller IC2 is capable of determining the coordinates of the position of the finger based on the driving timing of the common electrode CE (split electrodes C) and the positions of the detection electrodes Rx which output low detection signals Vr. The low detection signals Vr are output when the finger is adjacent to the detection electrodes Rx. The controller IC2 is electrically connected to the sensor interface 232 such that they are synchronized with each other in terms of the operation timing. The controller 102 is capable of comprehending a sensing period TDT, and receiving a detection signal Vr in the sensing period TDT. The controller 102 communicates with the detection electrode control signal generation module 231 via the sensor interface 232, and comprehends the operation state of the detection electrode control signal generation module 231 (for example, the driving state of the detection electrodes).

In the above structure, the block including the panel control signal generation module 220, the detection electrode control signal generation module 231, the timing controller 213, the oscillator 214, etc., may be collectively called a scanning drive module 242. The scanning drive module 242 comprises the clock generation module (oscillator 214), and is capable of performing display scanning by supplying a pixel signal and a display driving signal to the pixels in series in a time-divisional manner in synchronization with the clock of the clock generation module. The scanning drive module 242 supplies a drive signal for sensing to the detection electrodes.

In the above structure, the block including the sensor interface 232, the controller 102, etc., may be called a sensor detection module 243. The sensor detection module 243 is capable of performing sensing by sampling a detection signal Vr from each detection electrode Rx. The sensor detection module 243 obtains the coordinates of the contact position of the user's finger or the stylus on the display surface.

The driver IC1 comprises regulators 251 and 253, and a booster circuit 252, which may be referred to as a charge pump, as the power supply portion of the internal circuits. The regulator 251 receives power supply from a battery BATT, generates drive voltage in an output amplifier 251A, and stably outputs the drive voltage as shown in, for example, FIG. 8. The regulator 251 is capable of selectively loading a plurality of (for example, two) potential voltages from the battery BATT. The regulator 251 comprises a switch 251B and the output amplifier 251A for stable output, and switches the input potential by a control signal in the switch 251B. The drive voltage output from the regulator 251 is transmitted to the interface receiver 201, the image memory 202, the line latch circuit 203, the timing controller 213 and the oscillator 214.

The booster circuit 252 is structured by, for example, a DC-to-DC converter. As shown in FIG. 9, the booster circuit 252 receives power supply from the regulator 251, increases DC voltage to predetermined voltage by controlling the boosting frequency, and outputs the voltage to the amplifier 204. The regulator 253 which receives power supply from the booster circuit 252 in FIG. 7 generates drive voltage, and outputs the drive voltage to the panel control signal generation module 220 and the detection electrode control signal generation module 231. In this manner, individual circuit blocks are appropriately operated in the driver IC1.

The display device DSP is structured and driven as described above.

The display device DSP of the present embodiment uses a laminated film.

This specification explains the purpose of using the laminated film.

As stated above, the in-cell display device DSP causes the sensor SE to operate in a blanking period which stops display driving. The load to drive the panel differs between a display driving period and a non-display driving period (sensing period). Thus, the load is periodically changed. At this time, the booster circuit or the regulators for display driving cannot follow the change in load. In this manner, ripples are produced in the power source for display driving. The ripples may cause a capacitor to perform discharge and charge. The electrostrictive effect may cause the capacitor to constrict. This constriction may be transmitted to the flexible printed circuit FPC1. Thus, detrimental effects may be caused by a high-frequency wave. As one of the effects, audible noise is produced. Noise is produced from the oscillatory capacitor itself, or a portion to which the oscillation of the capacitor is transmitted. Audible noise may be offensive to the ear and displease the user.

To solve the above problem, a laminated film is used in the present embodiment.

Now, this specification explains the display device DSP of the present embodiment, mainly on the basis of the flexible printed circuit FPC1 comprising a laminated film. FIG. 10 is a cross-sectional view showing an end portion of the display device DSP of the present embodiment, and shows the flexible printed circuit FPC1, etc.

As shown in FIG. 10, the display panel PNL further comprises a sealing member A. The sealing member A is provided in a frame form outside the display area DA, and is located between the first substrate SUB1 and the second substrate SUB2. The liquid crystal layer LC is formed in the space surrounded by the first substrate SUB1, the second substrate SUB2 and the sealing member A.

The flexible printed circuit FPC1 is bent to, for example, the backlight unit BL side. The flexible printed circuit FPC1 may not be bent in a manner different from that of the present embodiment. For example, the flexible printed circuit FPC1 may be parallel to the display surface of the second substrate SUB2. Alternatively, the flexible printed circuit FPC1 may be parallel to a side surface of the first substrate SUB1. The flexible printed circuit FPC1 comprises a core substrate 1, and a plurality of capacitors 5 and 6.

The core substrate 1 comprises a flexible layer. The core substrate 1 uses resin such as polyimide for the base member. Thus, the core substrate 1 of the present embodiment is prepared by forming metal interconnects, etc., on a resin substrate. The core substrate 1 comprises a first surface SF1, and a second surface SF2 opposite to the first surface SF1. A part of the first surface SF1 functions as the installation surface for the capacitors 5 and 6.

In the present embodiment, the core substrate 1 is bent such that the second surface SF2 faces the backlight unit BL. However, the core substrate 1 is not limited to this structure. The core substrate 1 may be connected such that it is not bent. In the above explanation, the capacitors are provided on the first surface SF1 side of the core substrate 1. However, the positions of the capacitors are not limited to this example. The capacitors may be provided on the second surface SF2 side of the core substrate 1. In the above explanation, the capacitors are provided at positions facing the backlight unit BL. However, the positions of the capacitors are not limited to this example. The capacitors may be formed at positions facing a side surface of the display panel PNL or the backlight unit BL, or on a plane surface connected to the display panel PNL.

The capacitors 5 and 6 are provided on the first surface SF1 side of the core substrate 1. The flexible printed circuit FPC1 comprises a plurality of types of capacitors. The capacitors include the capacitors 5 which have difficulty in becoming oscillatory sources in comparison with the capacitor 6, and the capacitor 6 which easily becomes an oscillatory source in comparison with the capacitors 5. In the present embodiment, each capacitor 5 is a nonoscillatory source, and the capacitor 6 is an oscillatory source. The capacitor 6 is, for example, a capacitor connected to a circuit in which the change in load is large. Specifically, a capacitor connected to the regulator 251, the booster circuit 252, etc., is considered.

Both the capacitors 5 and the capacitor 6 are connected to the regulators 251 and 253, and the booster circuit 252 in principle. The driver IC1 may comprise a plurality of regulators 251, a plurality of regulators 253 and a plurality of booster circuits 252.

The capacitor connected to the regulator 253 for an analog signal output to the display panel PNL is a capacitor which comparatively produces noise.

Each capacitor connected to the regulator 251 for a signal used inside the driver IC1 is a capacitor which comparatively has difficulty in producing noise. The signal used inside the driver IC1 is, for example, a signal used in the timing controller, the oscillator, the interface and the memory.

In the above explanation, the display device comprises two types of capacitors which are different in terms of how easily each capacitor becomes an oscillator source. However, the capacitors of the display device may be the same as each other in terms of how easily each capacitor becomes an oscillator source. Alternatively, only one capacitor may be provided.

In the present embodiment, the capacitors 5 and 6 are ceramic capacitors. The capacitor 6 is an oscillatory source. Since the capacitor 6 is connected to a circuit which performs discharge and charge in specific cycles, the capacitor 6 can oscillate. When the capacitor 6 oscillates, noise may be produced from the capacitor 6 itself, or a portion to which the oscillation of the capacitor 6 is transmitted (specifically, on the core substrate 1, the vicinity of a portion physically connected to the capacitor 6).

The flexible printed circuit FPC1 further comprises a laminated film 10. At least, the laminated film 10 is provided beyond the capacitor 6 from the first surface SF1. The laminated film 10 is stuck to at least a part of the capacitor 6. In other words, the laminated film 10 is located above the first surface SF1, and covers at least a part of the capacitor 6. In the present embodiment, the laminated film 10 is provided beyond the capacitors 5 and 6 from the first surface SF1, and is stuck to the capacitors 5 and 6. The laminated film 10 is also stuck to the area surrounding the capacitors 5 and 6 on the first surface SF1. In other words, the laminated film 10 is located above the first surface SF1, and covers the capacitors 5 and 6.

FIG. 11 is a plan view showing the flexible printed circuit FPC1.

As shown in FIG. 11, the flexible printed circuit FPC1 comprises the capacitors 5 and 6. The capacitors 5 and 6 are densely arranged at intervals in a specific area of the first surface SF1. In the present embodiment, the capacitor 6 is provided such that the capacitors 5 and 6 are densely arranged in the same area. For example, the capacitors 5 and 6 are arranged at intervals of approximately 0.3 mm.

The laminated film 10 at least faces the capacitor 6, has a size so as to surround the capacitor 6, covers the capacitor 6, and surrounds the capacitor 6. In other words, at least in a plan view, the surface area of the laminated film 10 is greater than that of the capacitor 6. Further, the outer circumference of the capacitor 6 is located inside the outer circumference of the laminated film 10. In the present embodiment, the laminated film 10 faces all of the capacitors 5 and 6, has a size so as to surround all of the capacitors 5 and 6, and surrounds all of the capacitors 5 and 6. The laminated film 10 is stuck to the first surface SF1 without any gap in the whole circumference surrounding all of the capacitors 5 and 6.

In the present embodiment, the laminated film 10 is formed like a belt. The shape of the laminated film 10 is not particularly limited. The laminated film 10 must have a shape corresponding to the layout of the capacitors 5 and 6.

In plan view X-Y, the capacitors 5 and 6 are located at distance Da away from the outer edge of the laminated film 10, where distance Da is greater than or equal to a specific value. In other words, in plan view X-Y, the distance from the end of each of the capacitors 5 and 6 to the end of the laminated film 10 facing the end of the capacitor is distance Da. The lower limit of distance Da is not specified. However, distance Da is preferably greater than or equal to 1.5 mm. For example, the peripheral portion of the laminated film 10 needs to have a width greater than or equal to the height of the capacitors 5 and 6 in order to completely cover the capacitors 5 and 6. More specifically, distance Da is preferably greater than or equal to 1.5 mm before the laminated film 10 is stuck. In consideration of the above factors, the capacitors 5 and 6 are located at distance Da or greater away from the outer edge of the core substrate 1. When distance Da is ensured in the above manner, for example, the laminated film 10 can be satisfactorily stuck to the core substrate 1. For example, the laminated film 10 can be easily stuck to an appropriate position. Thus, the attachment can be simplified.

The above layout of the capacitors 5 and 6 is merely exemplary, and may be modified in various ways.

For example, the capacitor 6 may be located at distance Da away from the outer edge of the core substrate 1, and may be further located at distance Da away from the capacitors 5. In this case, the laminated film 10 may cover all of the capacitors 5 and 6. However, the laminated film 10 may face only the capacitor 6 out of all of the capacitors, have a size so as to surround the capacitor 6, and be stuck to the first surface SF1 without any gap in the whole circumference surrounding only the capacitor 6.

Alternatively, the flexible printed circuit FPC1 may comprise a plurality of capacitors 6. For example, only the capacitors 6 in the same type may be densely provided. In this case, the laminated film 10 may face only the capacitors 6, have a size so as to surround the capacitors 6, and be stuck to the first surface SF1 without any gap in the whole circumference surrounding only the capacitors 6.

FIG. 12 is a cross-sectional view showing the flexible printed circuit FPC1 along line XII-XII of FIG. 11.

As shown in FIG. 12, the capacitor 5 comprises a top surface 5a, a bottom surface 5b and a side surface 5c. The capacitor 6 comprises a top surface 6a, a bottom surface 6b and a side surface 6c. The top surfaces 5a and 6a face the laminated film 10, and are stuck to the laminated film 10. The outer edge portions of the laminated film 10 face the side surfaces 5c and 6c, and are stuck to the first surface SF1. The laminated film 10 may be stuck to the side surfaces 5c and 6c as well as the top surfaces 5a and 6a with regard to the capacitors 5 and 6. The bottom surfaces 5b and 6b face the first surface SF1 of the core substrate 1. In the present embodiment, an end of a terminal 8 is connected to the electrodes of the capacitors 5 and 6 on the side surfaces 5c and 6c. The other end is connected to the core substrate 1. The terminal 8 may be secured to the core substrate 1 such that the capacitors 5 and 6 are spaced from the first surface SF1. This structure can contribute to prevention of transmission of oscillation from the capacitor 6 to the core substrate 1.

The positional relationship between the bottom surfaces 5b and 6b and the first surface SF1 is not limited to the above example. For example, each of the bottom surfaces 5b and 6b may be partially in contact with the first surface SF1 of the core substrate 1. Each of the bottom surfaces 5b and 6b may be entirely in contact with the first surface SF1 of the core substrate 1.

FIG. 13 is a cross-sectional view showing the laminated film 10 shown in FIG. 10 to FIG. 12.

As shown in FIG. 13, the laminated film 10 at least comprises a first adhesive layer 11, and at least one of a first metal layer 12 and a first porous layer 13. The first metal layer 12 and the first porous layer 13 are located beyond the first adhesive layer 11 from the core substrate 1.

In the present embodiment, the laminated film 10 comprises the first adhesive layer 11, the first metal layer 12, the first porous layer 13, a first insulating layer 14, and bonding layers 16 and 17. The first adhesive layer 11, the first metal layer 12, the first porous layer 13 and the first insulating layer 14 have the same size, and their outer edges are flush with each other.

The first adhesive layer 11 faces the top surfaces 5a and 6a of the capacitors 5 and 6, and the first surface SF1. The first adhesive layer 11 adheres to the top surfaces 5a and 6a, and the first surface SF1. In the present embodiment, the first adhesive layer 11 is formed on a surface of the first porous layer 13 so as to face the first surface SF1. The first insulating layer 14 is located beyond the first adhesive layer 11 from the core substrate 1, and faces the first adhesive layer 11. In the present embodiment, the first insulating layer 14 electrically insulates the first metal layer 12 from the external members of the flexible printed circuit FPC1.

The first metal layer 12 is located between the first adhesive layer 11 and the first insulating layer 14. In the present embodiment, the first metal layer 12 is metal foil. As the metal foil, for example, copper foil using copper, silver foil using silver, or aluminum foil using aluminum is considered. The first metal layer 12 is preferably formed of copper (copper foil). When copper is used, a crack or break is difficult to generate on the first metal layer 12. Thus, it is possible to prevent degradation of sound insulating properties of the first metal layer 12.

The first metal layer 12 has at least sound insulating properties. Thus, the first metal layer 12 is capable of preventing transmission of the sound produced in the capacitor 6 and the vicinity of the capacitor 6 on the core substrate 1 to the outside of the flexible printed circuit FPC1.

The first metal layer 12 is capable of reducing at least part of the sound pressure level included in the audio frequency. The first metal layer 12 of the present embodiment has the following feature. The effect of reducing the sound pressure level in a frequency band greater than or equal to 10 kHz is higher than the effect of reducing the sound pressure level in a frequency band less than 10 kHz.

The first porous layer 13 is located between the first adhesive layer 11 and the first insulating layer 14, and faces the first metal layer 12. In the present embodiment, the first porous layer 13 is located between the first adhesive layer 11 and the first metal layer 12. The first porous layer 13 is formed of a porous material which is elastically deformed, a porous material of nonwoven fabric, etc. As a porous material which is elastically deformed, for example, glass wool or rock wool is considered. As a porous material of nonwoven fabric, for example, felt is applied.

The first porous layer 13 has at least sound absorption properties. Thus, the first porous layer 13 is capable of preventing transmission of the sound produced in the capacitor 6 and the vicinity of the capacitor 6 on the core substrate 1 to the outside of the flexible printed circuit FPC1. The first porous layer 13 converts part of energy into thermal energy by the friction or viscous resistance caused by the incursion of sound into the fine gaps inside the first porous layer 13 or the oscillation of the first porous layer 13 itself. In this manner, the first porous layer 13 is capable of reducing sound energy.

The first porous layer 13 is capable of reducing at least part of the sound pressure level included in the audio frequency. The first porous layer 13 of the present embodiment has the following feature. The effect of reducing the sound pressure level in a frequency band less than 10 kHz is higher than the effect of reducing the sound pressure level in a frequency band greater than or equal to 10 kHz.

The porosity of the first porous layer 13 is not specified. For example, the porosity of the first porous layer 13 is in a range of 10 to 90%. The porosity of the first porous layer 13 is preferably in a range of 20 to 60%. The porosity of the first porous layer 13 may be less than 20%. However, it should be noted that the sound absorption efficiency of the first porous layer 13 may be reduced with decreasing porosity of the first porous layer 13. The porosity of the first porous layer 13 may be greater than 60%. However, it should be noted that the strength (bending strength) of the first porous layer 13 may be reduced with increasing porosity of the first porous layer 13. For example, a crack or break is easily generated on the first porous layer 13.

The laminated film 10 of the present embodiment has a multilayered structure. Thus, the laminated film 10 uses the bonding layers 16 and 17. The bonding layer 16 is interposed between the first metal layer 12 and the first porous layer 13. Thus, the first metal layer 12 is bonded to the first porous layer 13 by the bonding layer 16. The bonding layer 17 is interposed between the first metal layer 12 and the first insulating layer 14. Thus, the first metal layer 12 is bonded to the first insulating layer 14 by the bonding layer 16.

The thickness of the first adhesive layer 11 is T11. The thickness of the first metal layer 12 is T12. The thickness of the first porous layer 13 is T13. The thickness of the first insulating layer 14 is T14. The thickness of the bonding layer 16 is T16. The thickness of the bonding layer 17 is T17. The thickness of the whole laminated film 10 of the present embodiment is T10. Thickness T10 is the sum of thicknesses T11, T12, T13, T14, T16 and T17. None of thicknesses T10, T11, T12, T13, T14, T16 and T17 is specified.

The first porous layer 13 and the bonding layer 16 form a laminated body 18. The laminated film 10 of the present embodiment comprises a single laminated body 18. However, the structure of the laminated film 10 is not limited to this example. A plurality of laminated bodies 18 may be stacked between the first adhesive layer 11 and the first metal layer 12. Alternatively, the laminated body 18 may be provided between the first insulating layer 14 and the bonding layer 17 as well as between the first adhesive layer 11 and the first metal layer 12.

The first metal layer 12 and the bonding layer 17 form another laminated body 19. The laminated film 10 of the present embodiment comprises a single laminated body 19. However, the structure of the laminated film 10 is not limited to this example. A plurality of laminated bodies 19 may be stacked between the bonding layer 16 and the first insulating layer 14. Alternatively, the laminated body 19 may be provided between the first adhesive layer 11 and the first porous layer 13 as well as between the bonding layer 16 and the first insulating layer 14.

In the first embodiment, the display device DSP having the above structures comprises the display panel PNL, the flexible printed circuit FPC1 coupled to the display panel PNL, etc. The flexible printed circuit FPC1 comprises the core substrate 1, the capacitor 6 provided on the first surface SF1 of the core substrate 1, the laminated film 10, etc. The laminated film 10 is provided beyond the capacitor 6 from the first surface SF1, and is stuck to at least a part of the capacitor 6.

The laminated film 10 comprises both the first metal layer 12 and the first porous layer 13. Thus, the laminated film 10 is capable of preventing transmission of the sound produced by the capacitor 6 itself to the outside of the flexible printed circuit FPC1. The sound is difficult to transmit to the other side through the laminated film 10 from the capacitor 6. For example, in the above sound, the laminated film 10 is capable of reducing at least part of the sound pressure level of the audio frequency.

The laminated film 10 is stuck to the capacitors including the capacitor 6, and is stuck to the first surface SF1 without any gap in the whole circumference surrounding the capacitors including the capacitor 6. It is possible to prevent sound from leaking out from the gap between the core substrate 1 and the laminated film 10. Thus, sound is more difficult to transmit to the outside of the flexible printed circuit FPC1.

The inventor of the present invention examined the sound pressure level related to the sound produced by the flexible printed circuit FPC1 with and without the laminated film 10. In the examination, the inventor used samples prepared by providing capacitors on some flexible printed circuits. As a result, in all of the samples, the reduction in the sound pressure level of the audio frequency when the laminated film 10 was used was greater than that when the laminated film 10 was not used.

Moreover, the inventor examined the sound pressure level when the oscillator oscillated at 4 kHz. The inventor conducted this examination, using some samples of evaluation devices prepared by providing capacitors on flexible printed circuits. The sound pressure level was examined when the laminated film 10 was used, and when the laminated film 10 was replaced by PET insulating tape for electric insulation. The thickness of the insulating tape was equal to thickness T10 of the laminated film 10. As a result, in all of the samples, the reduction in the sound pressure level of the audio frequency when the laminated film 10 was used was greater than that when the insulating tape was used.

Three samples of evaluation devices are exemplarily explained as samples 1, 2 and 3.

The sound produced by the flexible printed circuit FPC1 was examined for the evaluation device of sample 1 when the insulating tape was used, and when the laminated film 10 was used. In the examination, the oscillation conditions and the conditions for providing a microphone were the same. The same conditions for providing a microphone mean that the position of the microphone for the capacitor 6 in the space beyond the laminated film 10 (or the insulating tape) from the capacitor 6 was the same.

Figure 14:
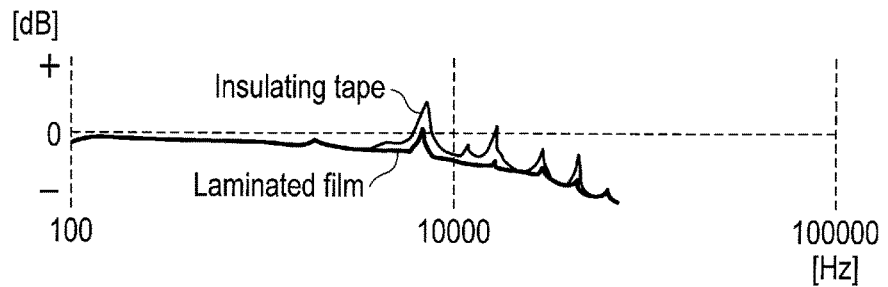
FIG. 14 graphically shows the change in the sound pressure level for a frequency when insulating tape and the laminated film of the first embodiment are selectively used in the evaluation device of sample 1.

As shown in FIG. 14, when the insulating tape was used, the sound pressure level had the main peak of 15.7 dB in the band of 8.5 kHz. When the laminated film 10 was used, the sound pressure level had the main peak of 2.3 dB in the band of 8.3 kHz.

The sound produced by the flexible printed circuit FPC1 was examined for the evaluation device of sample 2 by the same method as sample 1. When the insulating tape was used, the sound pressure level had the main peak of 12.1 dB in the band of 8.3 kHz. When the laminated film 10 was used, the sound pressure level had the main peak of 7.4 dB in the band of 8.3 kHz.

The sound produced by the flexible printed circuit FPC1 was examined for the evaluation device of sample 3 in the same manner. When the insulating tape was used, the sound pressure level had the main peak of 11.1 dB in the band of 8.3 kHz. When the laminated film 10 was used, the sound pressure level had the main peak of 1.9 dB in the band of 8.3 kHz.

In consideration of the above results, it is possible to obtain the laminated film 10, the flexible printed circuit FPC1 and the display device DSP, preventing the problems caused by oscillation.

Second Embodiment

Figure 15:
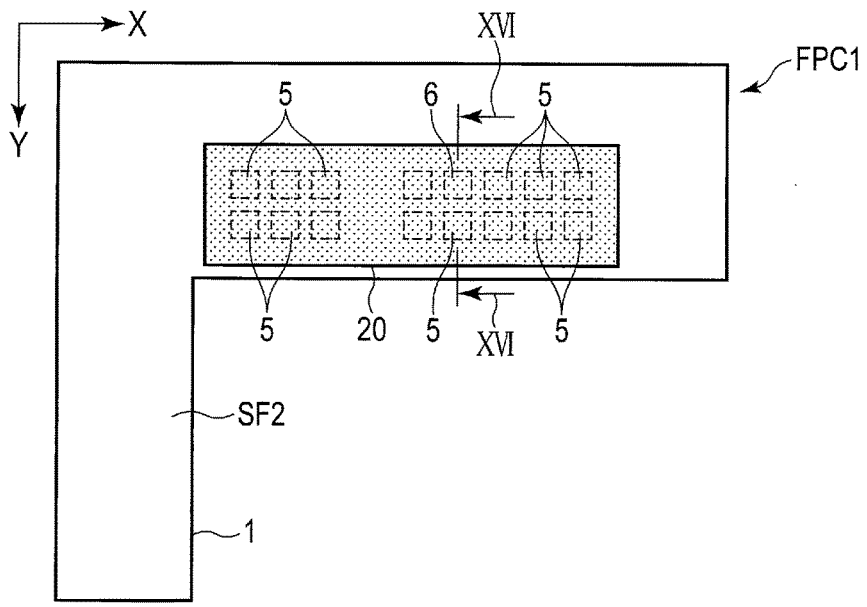
FIG. 15 is a plan view showing a flexible printed circuit provided in a liquid crystal display device according to a second embodiment.

Now, this specification explains a display device DSP according to a second embodiment. FIG. 15 is a plan view showing a flexible printed circuit FPC1 provided in the display device DSP according to the second embodiment.

As shown in FIG. 15, in the present embodiment, a laminated film 20 is used in place of the laminated film 10 of the first embodiment. Further, in the present embodiment, the laminated film 20 faces a second surface SF2 instead of a first surface SF1 of a core substrate 1. In terms of these structures, the present embodiment is different from the first embodiment.

The laminated film 20 at least faces a capacitor 6, has a size so as to surround the capacitor 6, and surrounds the capacitor 6. In other words, at least in a plan view, the surface area of the laminated film 20 is greater than that of the capacitor 6. The outer circumference of the capacitor 6 is located inside the outer circumference of the laminated film 20. In the present embodiment, the laminated film 20 faces all of the capacitors 5 and 6, has a size so as to surround all of the capacitors 5 and 6, and surrounds all of the capacitors 5 and 6. The laminated film 20 is stuck to the second surface SF2 without any gap in the whole area surrounding all of the capacitors 5 and 6.

In the present embodiment, the laminated film 20 is shaped like a band. The shape of the laminated film 20 is not particularly limited. The laminated film 20 must have a shape corresponding to the shape of the capacitor 6.

The laminated film 20 is stuck to only the flat second surface SF2 in a manner different from that of the laminated film 10 of the first embodiment. Thus, the laminated film 20 can be satisfactorily stuck to the second surface SF2 without considering the distance from the ends of the capacitors 5 and 6 to the end of the laminated film 20 facing the ends of the capacitors 5 and 6 in plan view X-Y. The laminated film 20 must face at least a part of the capacitor 6 through the core substrate 1. The size of the laminated film 20 is not particularly limited. However, the laminated film 20 preferably has a size so as to face the entire part of the capacitor 6, and faces the entire part of the capacitor 6 through the core substrate 1. The laminated film 20 further preferably has a size so as to surround the capacitor 6, faces the entire part of the capacitor 6 through the core substrate 1, and faces the vicinity of the area overlapping the capacitor 6 on the second surface SF2.

Figure 16:
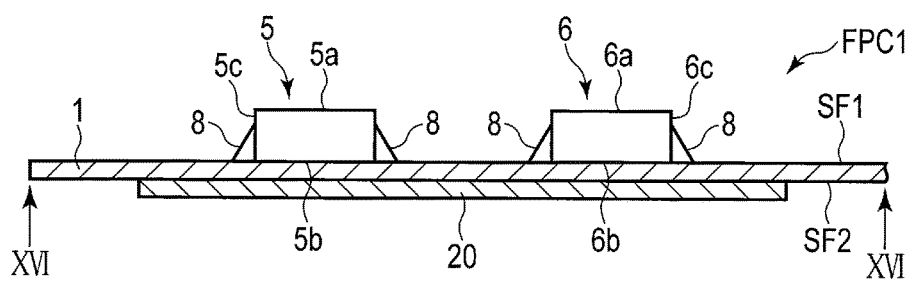
FIG. 16 is a cross-sectional view showing the flexible printed circuit along line XVI-XVI of FIG. 15.

FIG. 16 is a cross-sectional view showing the flexible printed circuit FPC1 along line XVI-XVI of FIG. 15.

As shown in FIG. 16, the laminated film 20 at least faces a bottom surface 6b of the capacitor 6 through the core substrate 1, and is stuck to the second surface SF2. In the present embodiment, the laminated film 20 faces the bottom surfaces 5b and 6b of the capacitors 5 and 6 through the core substrate 1. The outer edge portion of the laminated film 20 is stuck to the area surrounding the capacitors 5 and 6 on the second surface SF2.

FIG. 17 is a cross-sectional view showing the laminated film 20 shown in FIG. 15 and FIG. 16.

As shown in FIG. 17, the laminated film 20 at least comprises a second adhesive layer 21, and at least one of a second metal layer 22 and a second porous layer 23. In the present embodiment, the laminated film 20 comprises the second adhesive layer 21, the second metal layer 22, the second porous layer 23, a second insulating layer 24, and bonding layers 26 and 27.

The thickness of the second adhesive layer 21 is T21. The thickness of the second metal layer 22 is T22. The thickness of the second porous layer 23 is T23. The thickness of the second insulating layer 24 is T24. The thickness of the bonding layer 26 is T26. The thickness of the bonding layer 27 is T27. The thickness of the whole laminated film 20 of the present embodiment is T20. Thickness T20 is the sum of thicknesses T21, T22, T23, T24, T26 and T27.

In the present embodiment, the second adhesive layer 21 has the same structure as the above first adhesive layer 11. The second metal layer 22 has the same structure as the above first metal layer 12. The second porous layer 23 has the same structure as the above first porous layer 13. The second insulating layer 24 has the same structure as the above first insulating layer 14. The bonding layer 26 has the same structure as the above bonding layer 16. The bonding layer 27 has the same structure as the above bonding layer 17.

The structure of the laminated film 20 of the present embodiment is the same as that of the laminated film 10 of the first embodiment. However, the structure of the laminated film 20 is not limited to the example shown in FIG. 17, and may be modified in the same manner as the laminated film 10 of the first embodiment.

In the second embodiment, the display device DSP having the above structures comprises a display panel PNL, the flexible printed circuit FPC1 coupled to the display panel PNL, etc. The flexible printed circuit FPC1 comprises the core substrate 1, the capacitor 6 provided on the first surface SF1 of the core substrate 1, the laminated film 20, etc. The laminated film 20 faces the capacitor 6 through the core substrate 1, and is stuck to the second surface SF2.

The laminated film 20 comprises both the second metal layer 22 and the second porous layer 23. Thus, the laminated film 20 is capable of preventing transmission of the sound produced by the capacitor 6 itself to the outside of the flexible printed circuit FPC1. The sound is difficult to transmit to the other side through the laminated film 20 from the capacitor 6. For example, in the above sound, the laminated film 20 is capable of reducing at least part of the sound pressure level of the audio frequency.

Moreover, the laminated film 20 surrounds the capacitors including the capacitor 6 in a plan view. The laminated film 20 is capable of further preventing sound from leaking out to the second surface SF2 side. Thus, the laminated film 20 is capable of further preventing transmission of sound to the outside of the flexible printed circuit FPC1.

The above structures allow the laminated film 20, the flexible printed circuit FPC1 and the display device DSP to prevent the problems caused by oscillation.

Third Embodiment

Now, this specification explains a display device DSP according to a third embodiment. FIG. 18 is a cross-sectional view showing a part of a flexible printed circuit FPC1 provided in the display device DSP according to the third embodiment.

As shown in FIG. 18, in the present embodiment, both a laminated film 10 and a laminated film 20 are used. In this respect, the present embodiment is different from the first and second embodiments. The flexible printed circuit FPC1 comprises the laminated films 10 and 20. The laminated film 10 of the present embodiment has the same structure as the laminated film 10 of the first embodiment, and is stuck to a capacitor 6 and a first surface SF1. The laminated film 20 of the present embodiment has the same structure as the laminated film 20 of the second embodiment, and is stuck to a second surface SF2.

In the third embodiment, the display device DSP having the above structures comprises a display panel PNL, the flexible printed circuit FPC1 coupled to the display panel PNL, etc. The flexible printed circuit FPC1 comprises a core substrate 1, the capacitor 6 provided on the first surface SF1 of the core substrate 1, the laminated films 10 and 20, etc. Since both the laminated film 10 and the laminated film 20 are used, it is possible to prevent transmission of sound to both the space on the first surface SF1 side and the space on the second surface SF2 side.

The above structures allow the laminated films 10 and 20, the flexible printed circuit FPC1 and the display device DSP to prevent the problems caused by oscillation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the stacked structure of the laminated films 10 and 20 is not limited to the above examples, and may be modified in various ways. Some modification examples of the laminated film 10 are explained below as representative modification examples of the laminated films 10 and 20.

As shown in FIG. 19, the laminated film 10 of modification example 1 comprises the first adhesive layer 11 and the first porous layer 13. In a manner different from that of modification example 1, the first insulating layer 14 may be located beyond the first porous layer 13 from the first adhesive layer 11. However, in modification example 1, the laminated film 10 does not comprise the first metal layer 12, and further, the first porous layer 13 functions as an insulating layer. Thus, the laminated film 10 is formed without the first insulating layer 14.

The first porous layer 13 is capable of reducing at least part of the sound pressure level included in the audio frequency. Therefore, when the laminated film 10 is shaped like a band, the laminated film 10 can be called sound absorption tape. In modification example 1, similarly, the laminated film 10 is capable of preventing transmission of the sound produced by the capacitor 6 to the outside.

As shown in FIG. 20, the laminated film 10 of modification example 2 comprises the first adhesive layer 11, the first metal layer 12, the bonding layer 17 and the first insulating layer 14. The first metal layer 12 is interposed between the first adhesive layer 11 and the first insulating layer 14.

The first metal layer 12 is capable of at least reducing at least part of the sound pressure level included in the audible frequency. Therefore, when the laminated film 10 is shaped like a band, the laminated film 10 can be called sound insulating tape. In modification example 2, similarly, the laminated film 10 is capable of preventing transmission of the sound produced by the capacitor 6 to the outside.

In a manner different from that of modification example 2, the laminated film 10 may comprise an insulating layer between the first adhesive layer 11 and the first metal layer 12. In this way, the first metal layer 12 can be electrically insulated from the capacitors 5 and 6.

As shown in FIG. 21, the laminated film 10 of modification example 3 comprises a plurality of laminated bodies 18. In this respect, the laminated film 10 of modification example 3 is different from that of the first embodiment. In modification example 3, two laminated bodies 18 are stacked between the first adhesive layer 11 and the first metal layer 12.

Each first porous layer 13 is capable of reducing at least part of the sound pressure level included in the audio frequency. Thus, the laminated film 10 is capable of further preventing transmission of the sound produced by the capacitor 6 to the outside. When the number of laminated bodies 18 is two or more, the first porous layers 13 of the laminated bodies 18 may have different porosities.

As shown in FIG. 22, the laminated film 10 of modification example 4 is different from that of the first embodiment in respect that the first metal layer 12 (laminated body 19) and the first porous layer 13 (laminated body 18) change places with each other. In modification example 4, the first metal layer 12 is interposed between the first adhesive layer 11 and the first porous layer 13. In modification example 4, the laminated film 10 comprises both the first metal layer 12 and the first porous layer 13. Thus, the laminated film 10 is capable of reducing at least part of the sound pressure level included in the audio frequency and preventing transmission of the sound produced by the capacitor 6 to the outside.

Since the first porous layer functions as an insulating layer for the first metal layer against external elements, the first insulating layer 14 and the bonding layer 16 may be removed.

In the above embodiments and modification examples, some examples of the laminated films 10 and 20 are shown. The laminated films 10 and 20 must comprise at least a porous layer (13, 23). Alternatively, the laminated films 10 and 20 must comprise at least a metal layer (12, 22).

The layout of the capacitors 5 and 6 on the first surface SF1 is not limited to the above embodiments, and may be modified in various ways.

As shown in FIG. 23, when the capacitor 6 and the capacitors 5 are densely arranged at intervals in a specific area of the first surface SF1, the capacitor 6 may be located in the central region of the specific area. As shown in FIG. 23, in plan view X-Y, the capacitor 6 is surrounded by the capacitors 5. In plan view X-Y, the capacitor 6 is located beyond the capacitors 5 from the end of the laminated film 10. Thus, out of the capacitors 5 and 6, the capacitor 6 may be comparatively located away from the end of the laminated film 10.

As shown in FIG. 24, the laminated film 10 may be stuck to the side surfaces 5c and 6c of the capacitors 5 and 6 as well as the top surfaces 5a and 6a.

The elements provided on the core substrate 1 facing the laminated film 10 are not limited to the capacitors 5 and 6. A nonoscillatory source such as a resistive element or diode may be provided. The capacitor 6 may be surrounded by the resistive element, the diode, etc. The laminated film 10 may cover the resistive element, the diode and the capacitor 6.

The laminated film 10 must be stuck to at least a part of the capacitor 6. For example, the laminated film 10 must be stuck to at least a part of the top surface 6a or at least a part of the side surface 6c. The laminated film 20 must at least face a part of the capacitor 6 through the core substrate 1 and be stuck to the second surface SF2.

In the above embodiments, the capacitors 5 and 6 are ceramic capacitors. However, the capacitors 5 and 6 are not limited to this example. For example, the capacitors 5 and 6 may be tantalum electrolytic capacitors or aluminum electrolytic capacitors.

In the above embodiments, the flexible printed circuit FPC1 comprises only one capacitor 6. However, the number of capacitors 6 is not limited to one. The flexible printed circuit FPC1 may comprise a plurality of capacitors 6 as a plurality of oscillatory sources. The capacitors 6 may be covered by at least one of the laminated film 10 and the laminated film 20. When the capacitors 6 are arranged at intervals, the capacitors 6 may be covered by using one or more laminated films 10 or using one or more laminated films 20.

The laminated film 10 (or the laminated film 20) may be stuck to the surface of the oscillatory source in advance. For example, as shown in FIG. 25, an electron element 50 comprises a capacitor 51 as an oscillatory source, and a laminated film 52 stuck to the surface of the capacitor 51. The laminated film 52 must be stuck to at least a part of the surface of the capacitor 51. For example, the laminated film 52 may be stuck to the entire area of the surface of the capacitor 51 excluding a terminal 51a of the capacitor 51. The shape of the laminated film 52 is not limited to a band shape, and may be modified in various ways. The terminal 51a is formed by, for example, solder. The laminated film 52 may have the same structure as the laminated films 10 and 20, and may be modified in various ways in the same manner as the laminated films 10 and 20. The laminated film 52 must comprise the first adhesive layer, and at least one of the first metal layer and the first porous layer beyond the first adhesive layer from the capacitor 51.

In the above embodiments, the flexible printed circuit FPC1 is explained as an example of a printed circuit board. However, the printed circuit board is not limited to a flexible printed circuit such as the flexible printed circuit FPC1.

As shown in FIG. 26, the printed circuit board may be a rigid substrate RPC. The rigid substrate RPC comprises a core substrate 2, the capacitor 6, the laminated film 10, etc. The core substrate 2 comprises a rigid layer. The core substrate 2 uses a rigid member formed of, for example, glass epoxy, for the base member. Thus, the core substrate 2 is prepared by forming metal interconnects, etc., on a rigid substrate. The core substrate 2 comprises a first surface SF3, and a second surface SF4 opposite to the first surface SF3. A part of the first surface SF3 functions as the installation surface for the capacitor 6. The laminated film 10 is stuck to the capacitor 6 and the peripheral area of the first surface SF3.

In modification example 1 shown in FIG. 26, similarly, the laminated film 10 is capable of preventing transmission of the sound produced by the capacitor 6 to the outside. The core substrate 2 (rigid layer) is capable of reducing the effect caused by the oscillation of the capacitor 6 in comparison with the core substrate 1 (flexible layer). The core substrate 2 has the following advantage. Even when the capacitor 6 oscillates, sound is difficult to produce from a portion to which the oscillation of the capacitor 6 is transmitted.

In a manner different from that of modification example 1 shown in FIG. 26, the rigid substrate RPC may comprise the laminated film 20 stuck to the second surface SF4 in place of the laminated film 10. Alternatively, the rigid substrate RPC may use both the laminated film 10 and the laminated film 20.

As shown in FIG. 27, the printed circuit board may be a rigid flexible printed circuit RFPC. The rigid flexible printed circuit RFPC is prepared by combining a rigid substrate and a flexible printed circuit. The rigid flexible printed circuit RFPC comprises the core substrates 1 and 2, the capacitor 6, the laminated film 10, etc. The core substrate 1 comprises a flexible layer. The core substrate 2 comprises a rigid layer. The capacitor 6 is provided on the first surface SF3. The laminated film 10 is stuck to the capacitor 6 and the peripheral area of the first surface SF3.

Alternatively, as shown in FIG. 28, the capacitor 6 may be provided on the core substrate 1 side. The capacitor 6 is provided on the first surface SF1. The laminated film 10 is stuck to the capacitor 6 and the peripheral area of the first surface SF1.

In modification example 2 shown in FIG. 27 and modification example 3 shown in FIG. 28, similarly, the laminated film 10 is capable of preventing transmission of the sound produced by the capacitor 6 to the outside. The rigid flexible printed circuit RFPC may comprise the laminated film 10, or may use the laminated film 20 in place of the laminated film 10. Alternatively, the rigid flexible printed circuit RFPC may use both the laminated film 10 and the laminated film 20.

As shown in FIG. 29 and FIG. 30, the capacitor 6 may be covered by a shield case 70. The shield case 70 is a metal case comprising a base member formed of nickel silver/stainless steel (SUS)/tin plate, etc. A surface treatment of Ni/Sn, etc., may be applied to the base member. When the shield case 70 is used, the laminated film 10 may be directly stuck to the capacitor 6. However, as shown in the figures, the laminated film 10 may be stuck to the shield case 70 side. The laminated film 10 may be stuck to the surface (inner surface) of the shield case 70 facing the capacitor 6 (FIG. 29). The laminated film 10 may be stuck to the surface (external surface) of the shield case 70 opposite to the surface facing the capacitor 6 (FIG. 30). The laminated film 10 may be stuck to both the inner surface and the external surface of the shield case 70.

As shown in FIG. 31, the split electrodes C may extend in the second direction Y, and may be arranged at intervals in the first direction X, in a manner different from that of the first embodiment (FIG. 5). The common electrode drive circuit CD may be provided in parallel with either the signal line selection circuit MUP or the scanning line drive circuit GD. The detection electrodes Rx extend in the first direction X, and are arranged at intervals in the second direction Y.

In place of or in addition to the above sensor in a mutual-capacitive detection system, the sensor SE may form a sensor in a self-capacitive detection system. In a self-capacitive detection system, similarly, both display driving and sensing driving can be controlled in a time-divisional manner.

For example, the sensor SE may form a sensor in a self-capacitive detection system by using the detection electrodes Rx. In this case, a drive signal Vw may be supplied to the detection electrodes Rx, and a detection signal Vr may be detected from the detection electrodes Rx. The detection electrodes Rx may be provided in stripes. Alternatively, the detection electrodes Rx may be arranged in matrix.

Alternatively, the sensor SE may form a sensor in a self-capacitive detection system by using the pixel electrodes PE arranged in matrix. The pixel electrodes PE are used for both display driving and sensing driving. At the time of sensing driving, a drive signal Vw is supplied to the pixel electrodes PE, and a detection signal Vr is detected from the pixel electrodes PE. Writing of a drive signal Vw to the pixel electrodes PE and reading of a detection signal Vr from the pixel electrodes PE may be performed via the signal lines S. In this case, the driver IC1 and the controller 102 may be incorporated into one chip.

Alternatively, the sensor SE may form a sensor in a self-capacitive detection system by using the split electrodes C. The split electrodes C may be provided in stripes. Alternatively, the split electrodes C may be arranged in matrix. The split electrodes C (common electrode CE) are used for both display driving and sensing driving.

Figure 32:
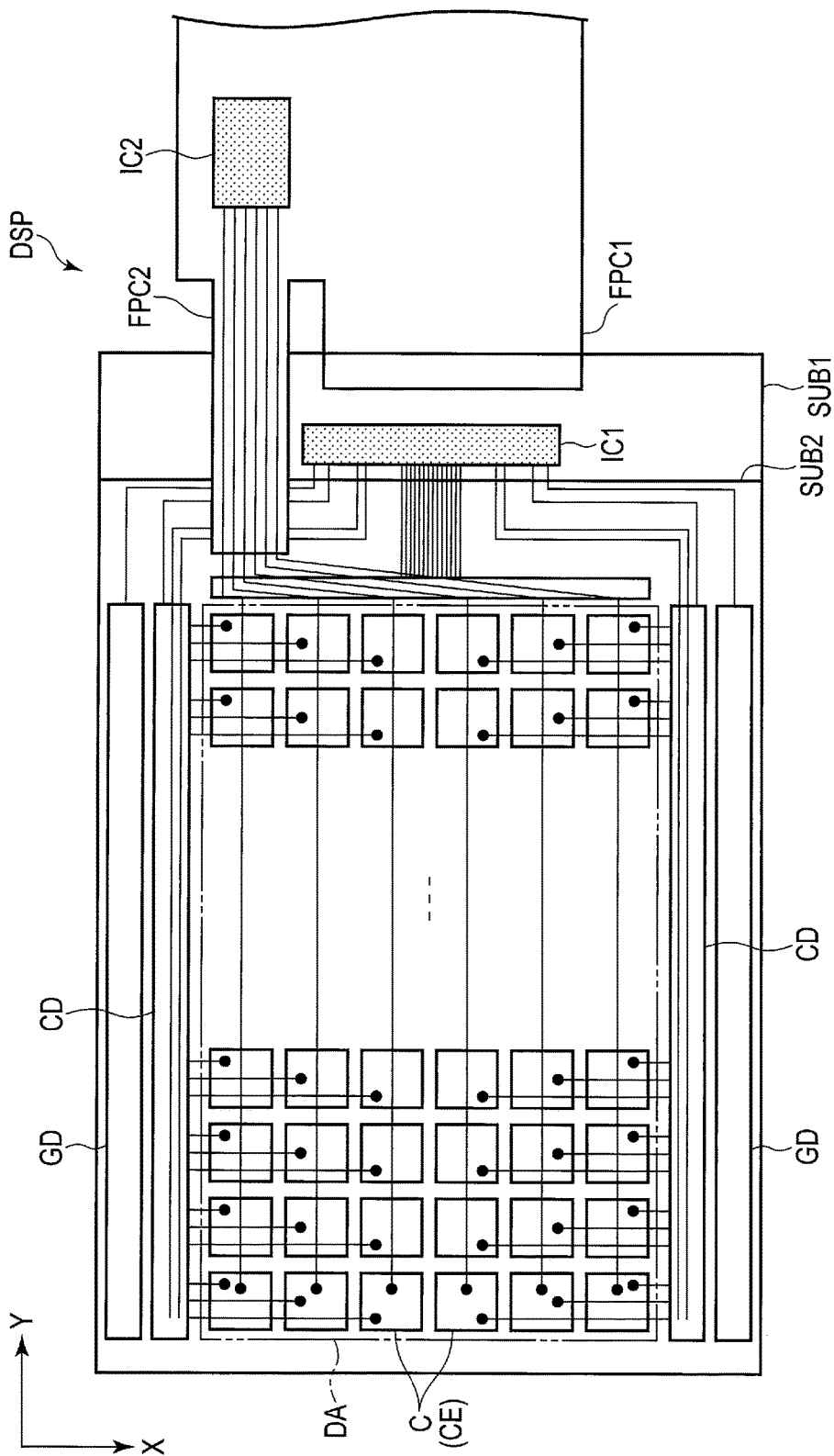
FIG. 32 shows another modification example of the structure of the sensor.

For example, as shown in FIG. 32, the split electrodes C are arranged in matrix. Two common electrode drive circuits CD are provided outside the display area DA. The display area DA is interposed between the two common electrode drive circuits CD in the first direction X. Each split electrode C is driven by one of the common electrode drive circuits CD. Common voltage Vcom is applied to each split electrode C during a display driving period. A drive signal Vw is supplied to each split electrode C during a sensing period. The controller 102 detects a detection signal Vr from each split electrode C via the interconnects of the first substrate SUB1, the flexible printed circuit FPC2, etc.

In the example shown in FIG. 32, similarly, the display device DSP may be formed without the controller 102 or the flexible printed circuit FPC2. The function of the controller 102 may be incorporated into the driver IC1.

When a sensor in a self-capacitive detection system is formed by using the pixel electrodes PE or the split electrodes C, each sensor electrode functions as both a drive electrode and a detection electrode Rx. Thus, there is no need to additionally form the detection electrode Rx.

In the above embodiments, the oscillatory source is the capacitor 6 or 51. However, the oscillatory source is not limited to a capacitor.

In the above embodiments, a liquid crystal display device is disclosed as an example of a display device. However, the embodiments may be applicable to various flat-panel display devices such as organic electroluminescent display devices, other self-luminous display devices, or electronic paper display devices having cataphoresis elements. As a matter of course, the above embodiments may be applied to small, medium-sized or large display devices without particular limitation.

The above embodiments are not limited to display devices, and may be applicable to various electronic devices other than display devices. For example, the laminated film 10 or the laminated film 20 may be provided for capacitors mounted on earphones or wearable devices. Regarding display devices, the embodiments may be applicable to display devices mounted on in-vehicle displays, smartphones, wearable devices, personal computers, television receivers, video cameras, etc.

What is claimed is:

1. A display device comprising:
 a display panel comprising a display surface, a first substrate, and a plurality of pixels arranged between the first substrate and the display surface; and
 a printed circuit board coupled to the display panel, wherein
 the printed circuit board comprises:
  a core substrate including a first surface, and a second surface opposite to the first surface;
  an oscillatory source provided on the first surface of the core substrate; and
  a laminated film provided beyond the oscillatory source from the first surface, or facing the oscillatory source through the core substrate, and
 the laminated film comprises:
  a first adhesive layer in direct contact with at least one of the oscillatory source or the core substrate;
  a first insulation layer; and
  a first porous layer located between the first adhesive layer and the first insulation layer,
 the first porous layer is in contact with at least one of the first insulation layer or the first adhesive layer, and
 the oscillatory source and the laminated film are not located between the display surface and the first substrate.

2. The display device of claim 1, wherein
the laminated film comprises a first metal layer located between the first adhesive layer and the first insulating layer.

3. The display device of claim 2, wherein
the laminated film comprises a second insulation layer located between the first metal layer and the first porous layer.

4. The display device of claim 1, wherein
the laminated film comprises a first metal layer located between the first adhesive layer and the first porous layer.

5. The display device of claim 1, wherein
the laminated film is stuck to the oscillatory source, and is further stuck to the first surface in a whole circumference surrounding the oscillatory source.

6. The display device of claim 1, further comprising:
another laminated film which faces the oscillatory source through the core substrate and is stuck to the second surface, wherein
the laminated film is provided beyond the oscillatory source from the first surface,
the first adhesive layer is in direct contact with the oscillatory source, and
the other laminated film comprises:
 a second adhesive layer in direct contact with the core substrate; and
 at least one of a second metal layer and a second porous layer located beyond the second adhesive layer from the core substrate.

7. The display device of claim 1, wherein
the oscillatory source is a capacitor.

8. The display device of claim 7, wherein
the capacitor is a ceramic capacitor.

9. The display device of claim 7, wherein
the capacitor is connected to a circuit which performs discharge and charge in specific cycles.

10. The display device of claim 1, further comprising:
a plurality of non-oscillatory sources provided on the first surface of the core substrate, wherein
the oscillatory source is located in a central region of an area in which the oscillatory source and the non-oscillatory sources are provided, and
the laminated film is arranged on the oscillatory source and at least one of the non-oscillatory sources.

11. The display device of claim 1, wherein
a distance from an end of the oscillatory source to an end of the laminated film facing the end of the oscillatory source is greater than or equal to 1.5 mm.

12. The display device of claim 1, wherein
the laminated film comprises a first metal layer which is formed of copper.

13. The display device of claim 1, wherein
the first porous layer is formed of a porous material of nonwoven fabric.

* * * * *